United States Patent
Tung et al.

(10) Patent No.: US 12,382,691 B2
(45) Date of Patent: *Aug. 5, 2025

(54) EFFECTIVE WORK FUNCTION TUNING VIA SILICIDE INDUCED INTERFACE DIPOLE MODULATION FOR METAL GATES

(71) Applicant: Taiwan Semiconductor Manufacturing Company, Ltd., Hsin-Chu (TW)

(72) Inventors: Yen-Tien Tung, Hsinchu (TW); Szu-Wei Huang, Hsinchu (TW); Zhi-Ren Xiao, Hsinchu (TW); Yin-Chuan Chuang, Hsinchu (TW); Yung-Chien Huang, Hsinchu (TW); Kuan-Ting Liu, Hsinchu (TW); Tzer-Min Shen, Hsinchu (TW); Chung-Wei Wu, Hsin-Chu County (TW); Zhiqiang Wu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/669,199

(22) Filed: May 20, 2024

(65) Prior Publication Data

US 2024/0313067 A1    Sep. 19, 2024

Related U.S. Application Data

(63) Continuation of application No. 18/064,039, filed on Dec. 9, 2022, now Pat. No. 11,990,522, which is a
(Continued)

(51) Int. Cl.
*H01L 29/40* (2006.01)
*H01L 21/3205* (2006.01)
(Continued)

(52) U.S. Cl.
CPC ....... *H10D 64/01* (2025.01); *H01L 21/32053* (2013.01); *H10D 30/6735* (2025.01);
(Continued)

(58) Field of Classification Search
CPC ............ H01L 29/401; H01L 21/32053; H01L 29/42392; H01L 29/4966; H01L 29/517;
(Continued)

(56) References Cited

U.S. PATENT DOCUMENTS

| 8,836,016 B2 | 9/2014 | Wu et al. |
| 8,841,701 B2 | 9/2014 | Lin et al. |

(Continued)

OTHER PUBLICATIONS

Huang, Mao-Lin, et al., "Gate Patterning Process for Multi-Gate Devices," U.S. Appl. No. 16/858,440, filed Apr. 24, 2020. Assignee: Taiwan Semiconductor Manufacturing Co., Ltd., 32pages of specification, 38 pages of drawings.
(Continued)

*Primary Examiner* — Tong-Ho Kim
(74) *Attorney, Agent, or Firm* — HAYNES AND BOONE, LLP

(57) ABSTRACT

A semiconductor structure includes a substrate and a semiconductor channel layer over the substrate. The semiconductor structure includes a high-k gate dielectric layer over the semiconductor channel layer, a work function metal layer over the high-k gate dielectric layer, and a bulk metal layer over the work function metal layer. The work function metal layer includes a first portion and a second portion over the first portion. Both the first portion and the second portion are conductive. Materials included in the second portion are also included in the first portion. The first portion is doped with silicon at a first dopant concentration, and the second
(Continued)

portion is not doped with silicon or is doped with silicon at a second dopant concentration lower than the first dopant concentration.

20 Claims, 18 Drawing Sheets

Related U.S. Application Data continuation of application No. 17/144,794, filed on Jan. 8, 2021, now Pat. No. 11,527,622.

(51) Int. Cl.
| | |
|---|---|
| *H01L 29/423* | (2006.01) |
| *H01L 29/49* | (2006.01) |
| *H01L 29/51* | (2006.01) |
| *H01L 29/786* | (2006.01) |
| *H10D 30/67* | (2025.01) |
| *H10D 64/01* | (2025.01) |
| *H10D 64/66* | (2025.01) |
| *H10D 64/68* | (2025.01) |

(52) U.S. Cl.
CPC ....... *H10D 30/6757* (2025.01); *H10D 64/667* (2025.01); *H10D 64/691* (2025.01)

(58) Field of Classification Search
CPC ........... H01L 29/78696; H01L 29/0673; H01L 29/66439; H01L 29/66795; H01L 29/775; H01L 21/823443; H01L 21/823835; H01L 29/4232; B82Y 10/00

USPC ........................................................ 257/410
See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 11,527,622 B2 | 12/2022 | Tung et al. | |
| 11,990,522 B2 * | 5/2024 | Tung | H01L 29/517 |
| 2012/0122286 A1 | 5/2012 | Kim et al. | |
| 2014/0004693 A1 | 1/2014 | Hoon | |
| 2020/0135879 A1 | 4/2020 | Cheng et al. | |
| 2021/0265496 A1 * | 8/2021 | Chu | H01L 29/0673 |

OTHER PUBLICATIONS

Chu, Lung-Kun, et al., "Dipole Patterning for CMOS Devices," U.S. Appl. No. 16/879,613, filed May 20, 2020. Assignee: Taiwan Semiconductor Manufacturing Co., Ltd., 31 pages of specification, 26 pages of drawings.

* cited by examiner

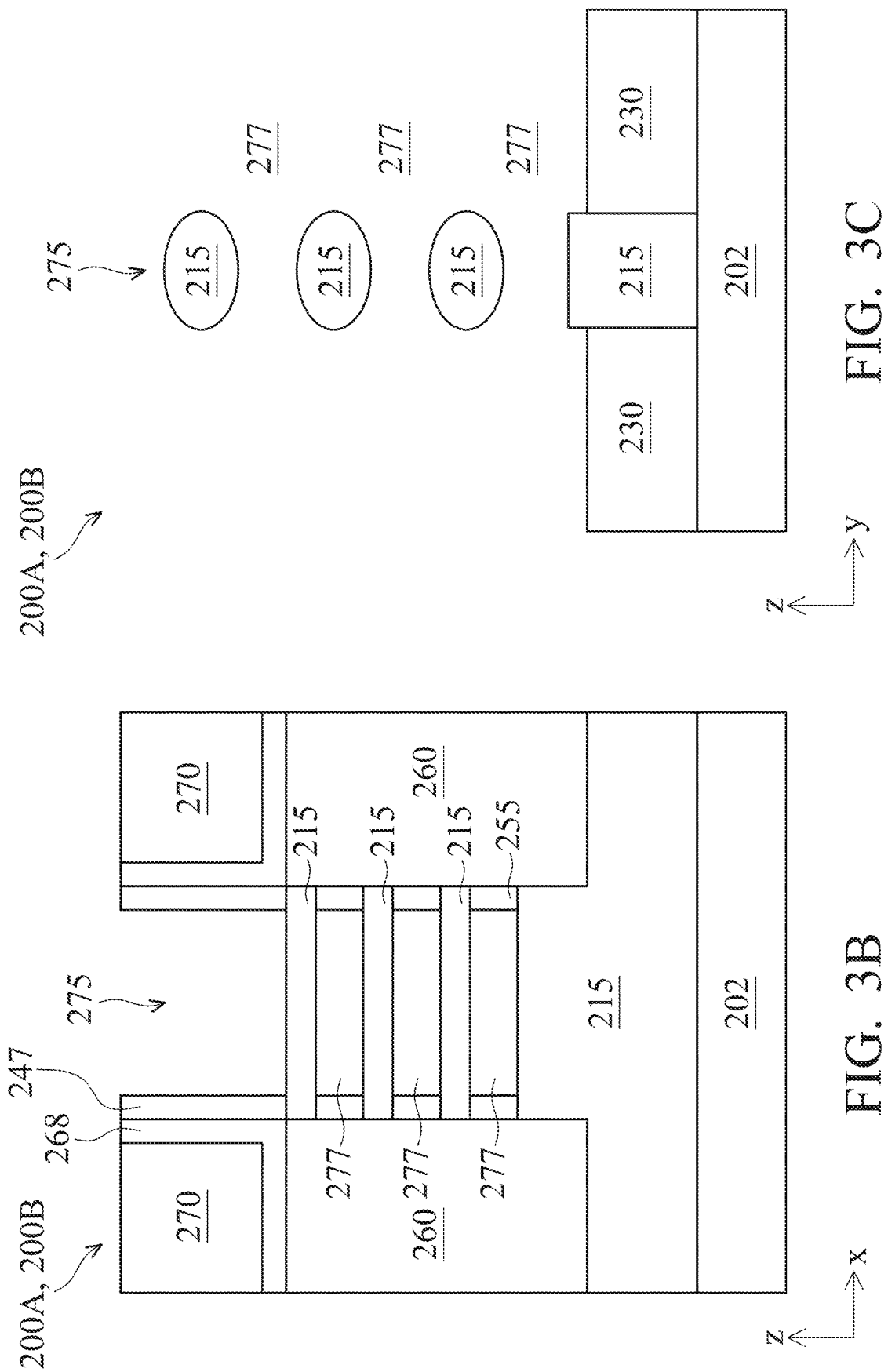

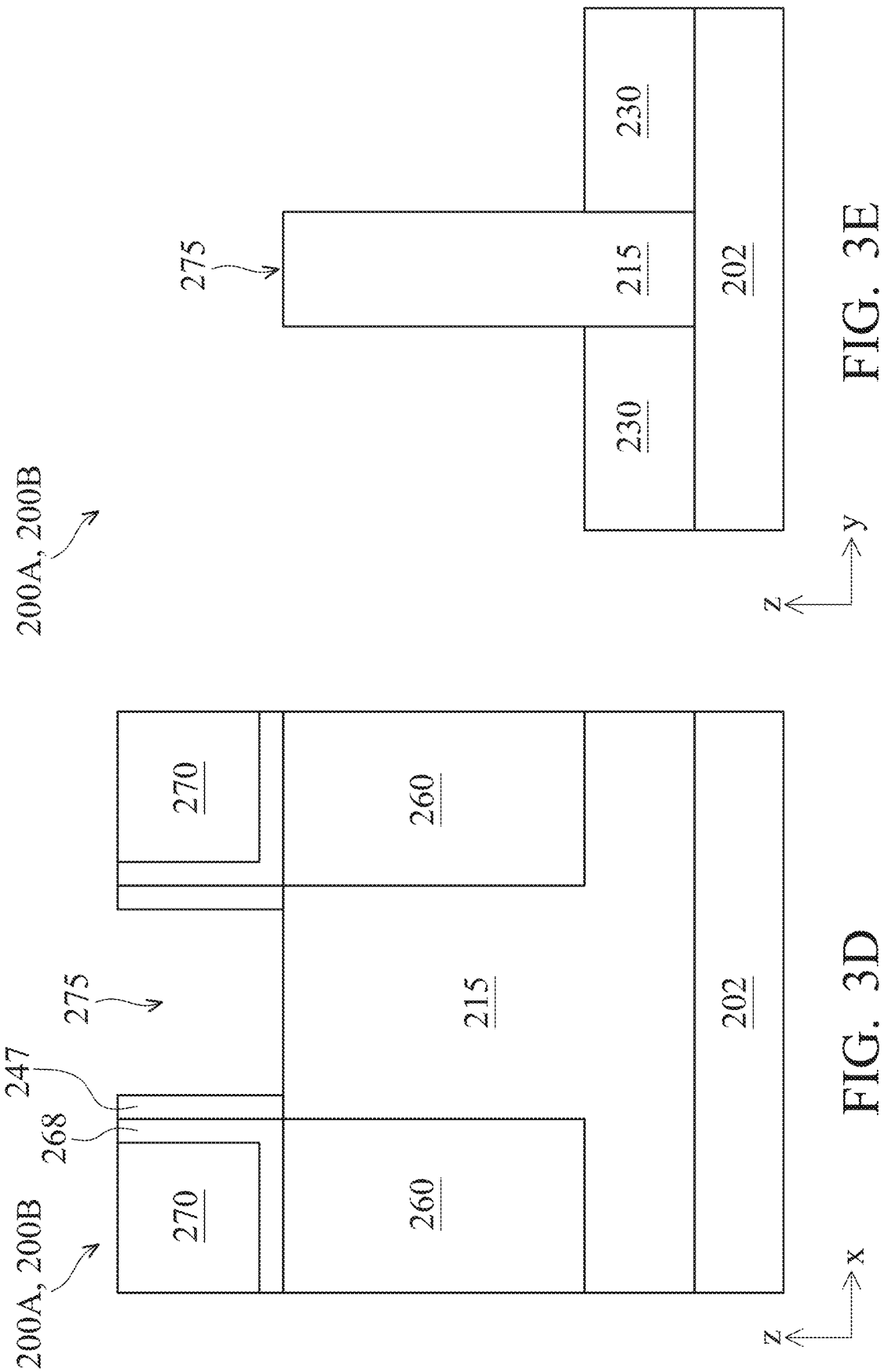

EFFECTIVE WORK FUNCTION TUNING VIA SILICIDE INDUCED INTERFACE DIPOLE MODULATION FOR METAL GATES

PRIORITY DATA

This is a Continuation application of U.S. application Ser. No. 18/064,039 filed Dec. 9, 2022, which is a continuation application of U.S. application Ser. No. 17/144,794 filed Jan. 8, 2021, each of which are hereby incorporated herein by reference in their entireties.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology. One area of advances is how to provide CMOS devices with proper threshold voltages (Vt) for both NMOS and PMOS transistors for boosting performance while reducing power consumption. Particularly, Vt engineering has been challenging as devices continue to scale down to multi-gate devices, such as FinFET, gate-all-around (GAA) devices including nanowire devices and nanosheet devices, and other types of multi-gate devices. One reason is that these devices are very small and there is not much room for tuning their Vt's using thick work function metals like what has been done traditionally.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3B and 3C are diagrammatic cross-sectional views of the semiconductor device in FIG. 3A, in portion, according to an embodiment of the present disclosure. FIGS. 3D and 3E are diagrammatic cross-sectional views of the semiconductor device in FIG. 3A, in portion, according to another embodiment of the present disclosure.

DETAILED DESCRIPTION

Figure 1:
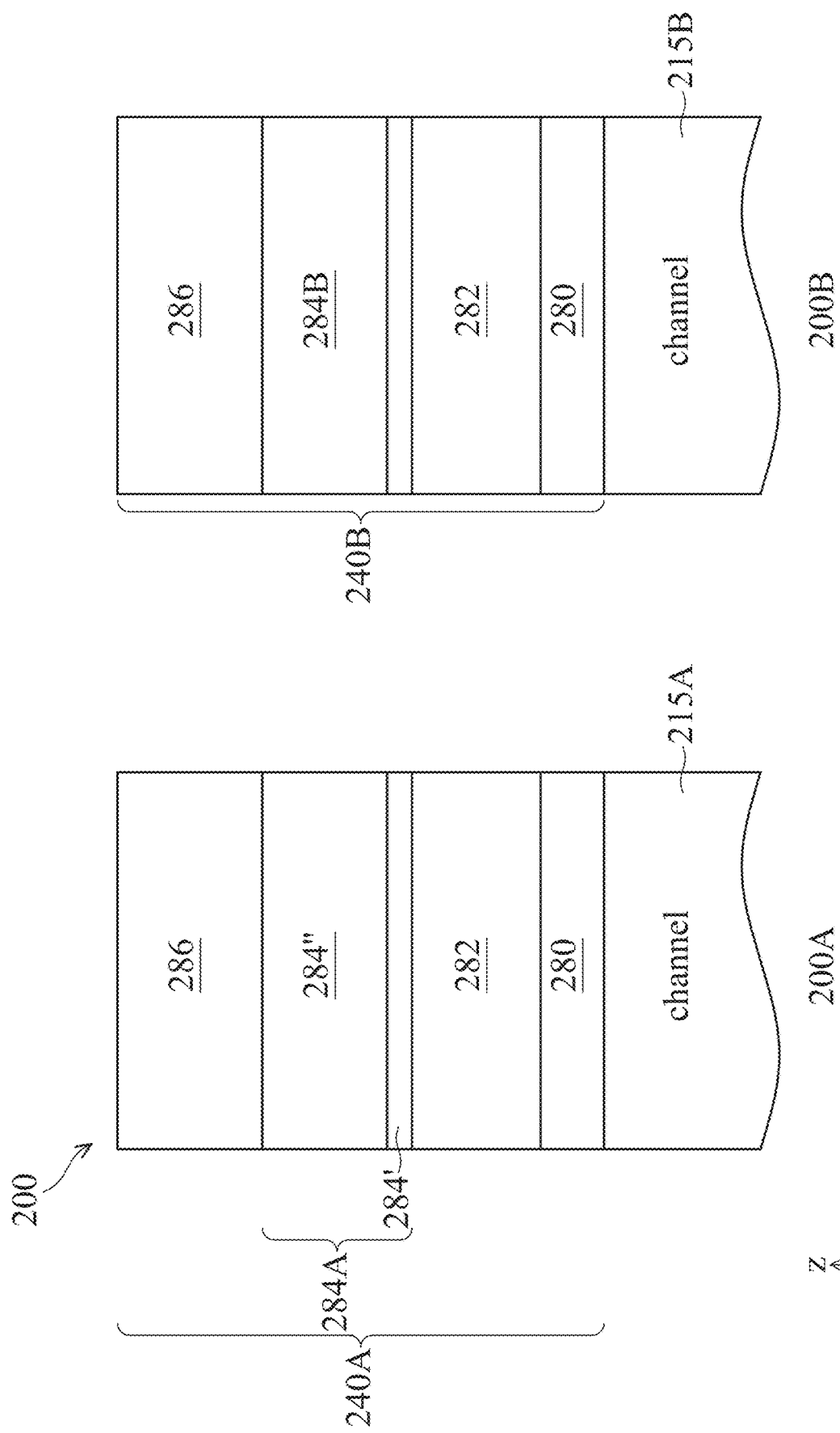
FIG. 1 is a diagrammatic view of a semiconductor device, in portion, according to the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure relates generally to semiconductor structures and fabrication processes thereof, and more particularly to semiconductor devices with high-k metal gates (HKMG) whose work function metal (WFM) layer is doped with silicon for tuning (reducing) the effective work function (eWF) of the HKMG. Effective work function tuning has become more and more challenging due to the continued down-scaling of device size and device pitch. Some approaches use a WFM layer with high aluminum concentration for eWF tuning. To get the eWF close to 4 eV, the WFM layer has to be thick such as a few nanometers thick. Filling such thick work function metal in small devices (such as small FinFET or GAA devices) has become more and more difficult. Unlike those approaches, the present disclosure disposes a silicide layer over a thin WFM layer (such as about 1 nm to about 1.5 nm thick, a few times thinner than other approaches) and anneals the structure to cause silicon elements to dope into a portion of the WFM layer that interfaces with an underlying high-k (HK) gate dielectric layer. The silicon elements produce dipole effects, thereby reducing the eWF of the HKMG. Based on data from experiment and simulations, every 1% of silicon dopant centration at the WFM and HK interface can reduce the eWF by about 55 mV, while every 1% of aluminum dopant centration at the WFM and HK interface can only reduce the eWF by about 26 mV. Thus, the disclosed methods of doping the WFM with silicon is very effective in reducing the eWF of a HKMG. In some experiments, the eWF can be reduced to close to 4.0 eV even with a very thin WFM layer (such as about 1 nm to about 1.5 nm thick).

FIG. 1 illustrates a schematic view of a portion of a device 200 implemented with eWF tuning according to the present disclosure. The device 200 includes a transistor (e.g., a field effect transistor or FET) 200A and another transistor (FET) 200B. For illustration purposes, WFM layer 284A in the FET 200A is doped with silicon for eWF tuning while WFM layer 284B in the FET 200B is not doped with silicon. As a result, the eWF of the FET 200A is lower than the eWF of the FET 200B, when everything else is the same between the FET 200A and the FET 200B. In an embodiment, the device 200 is a CMOS device, the FET 200A is an NFET, and the FET 200B is a PFET. In another embodiment, both the FET 200A and the FET 200B are NFET. In yet another embodiment, both the FET 200A and the FET 200B are PFET. Thus, the present disclosure can provide different eWF (and different threshold voltages) for NFETs and PFETs.

The FET 200A includes a gate stack 240A over a channel layer 215A. The FET 200B includes a gate stack 240B over another channel layer 215B. In embodiments, the channel layers 215A and 215B may each include silicon (such as crystalline silicon or intrinsic silicon), germanium, silicon germanium, or other suitable semiconductor materials. The channel layers 215A and 215B may include the same material or different materials in various embodiments.

The gate stack 240A includes an interfacial layer 280, a high-k gate dielectric layer 282, the WFM layer 284A, and a bulk metal layer 286. The gate stack 240B includes the interfacial layer 280, the high-k gate dielectric layer 282, the WFM layer 284B, and the bulk metal layer 286. In an embodiment, the interfacial layer 280 includes $SiO_2$ or SiON, the high-k gate dielectric layer 282 includes $HfO_2$ or other Hf-based high-k dielectric, the WFM layer 284A includes TiN or other nitride-based metallic material, and the bulk metal layer 286 includes tungsten. The WFM layer 284A and the bulk metal layer 286 form a gate electrode (or at least a part thereof) for the FET 200A. The WFM layer 284B and the bulk metal layer 286 form a gate electrode (or at least a part thereof) for the FET 200B.

The WFM layer 284A has two portions 284' and 284". The portion 284' interfaces with the high-k gate dielectric layer 282. The portion 284" interfaces with the bulk metal layer 286. The WFM layer 284A is doped with silicon. The WFM layer 284B is not doped with silicon. As will be discussed, due to an annealing process (and other factors) according to the present disclosure, silicon elements doped into the WFM layer 284A tend to accumulate or distribute in the portion 284' that is close to the high-k gate dielectric layer 282. In some embodiments, the portion 284' may have a thickness (along the "z" direction) in a range of about 2 Å to 4 Å. In an embodiment, the portion 284' is doped with silicon with a silicon dopant concentration in a range of about 1% to about 10%. In some embodiments, such silicon dopant concentration can reduce the eWF of the FET 200A by a value in a range from about 55 mV to about 550 mV. Experiments have shown that such eWF tuning range is sufficient while not adding too much manufacturing costs. When the silicon dopant concentration is too low (such as lower than 1%), the eWF tuning effect may be too small to be practically useful (but can certainly be achieved using the present disclosure). On the other hand, to increase the silicon dopant concentration to be much higher than 10% would prolong the manufacturing process, thus incurring added costs as will be discussed. In an embodiment, the portion 284" is not doped with silicon. In another embodiment, the portion 284" is doped with silicon with a silicon dopant concentration much lower than that in the portion 284'. For example, the silicon dopant concentration in the portion 284" may be 10 times lower than that in the portion 284' in an embodiment. In an embodiment, the silicon dopant concentration in the portion 284" is 0.1% or lower, 0.01% or lower, or 0.001% or lower. In some embodiment, the silicon dopant concentration in the portion 284" is in a range of about 0.001% to about 0.1%.

The present disclosure can be used to flexibly tune the eWF and threshold voltages for CMOS devices. Further, having a thin layer of WFM layer (such as the layer 284A and 284B in FIG. 1) for both NFET and PFET allows the gate stacks 240A and 240B to be fabricated for very small sized devices, such as FinFET and GAA devices whose channel length is only a few nanometers. The present disclosure can be applied to multi-gate CMOS devices, such as FinFET and gate-all-around (GAA) CMOS devices, as well as planar CMOS devices.

The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. The present disclosure also briefly discusses the implementation of the eWF tuning in FinFET devices. Those of ordinary skill in the art should appreciate that they may readily use the present disclosure as a basis for designing or modifying other processes and structures for carrying out the same purposes and/or achieving the same advantages of the embodiments introduced herein.

Figure 2:
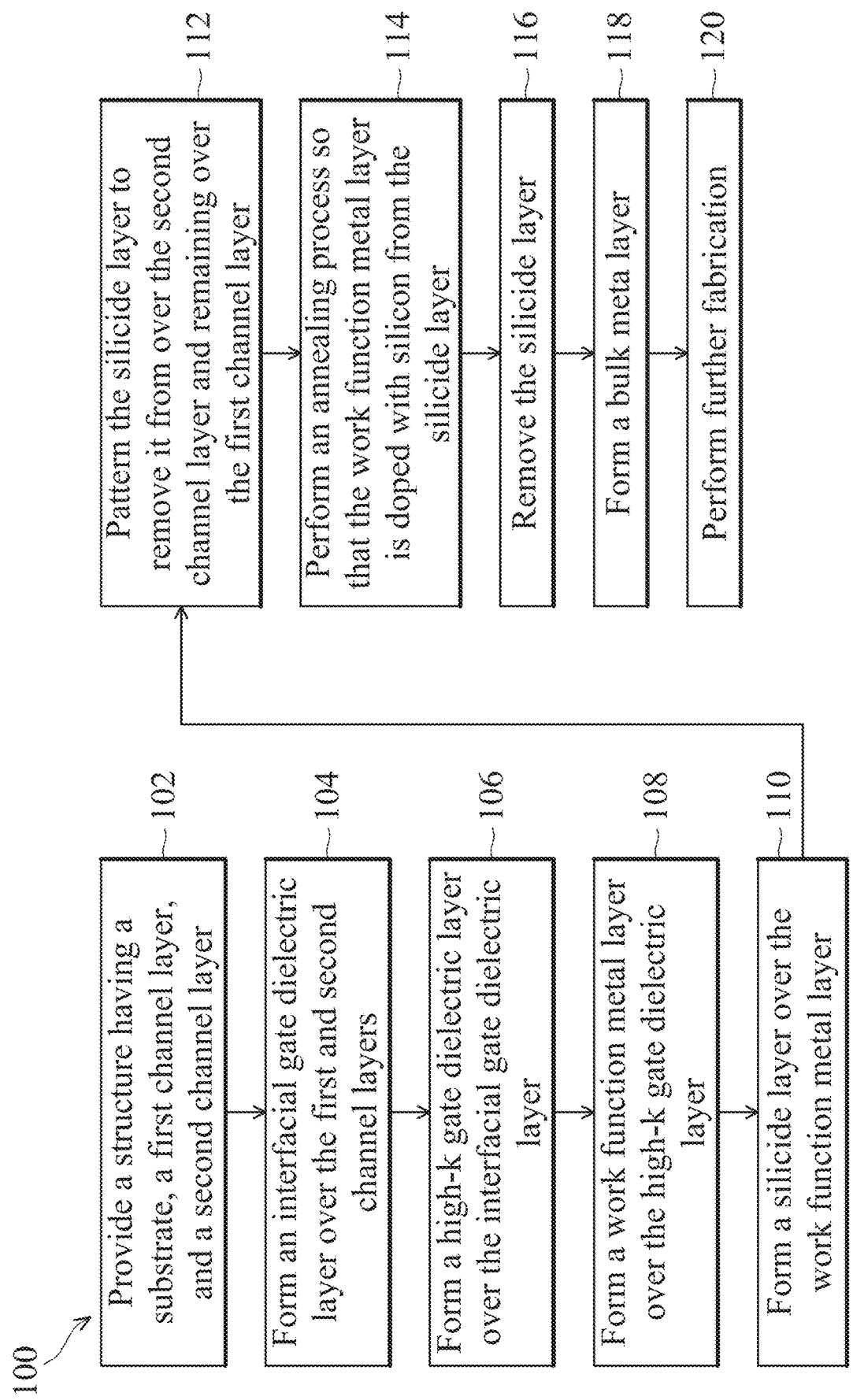
FIG. 2 is a flow chart of a method for fabricating a semiconductor device according to various aspects of the present disclosure.
Figure 3A:
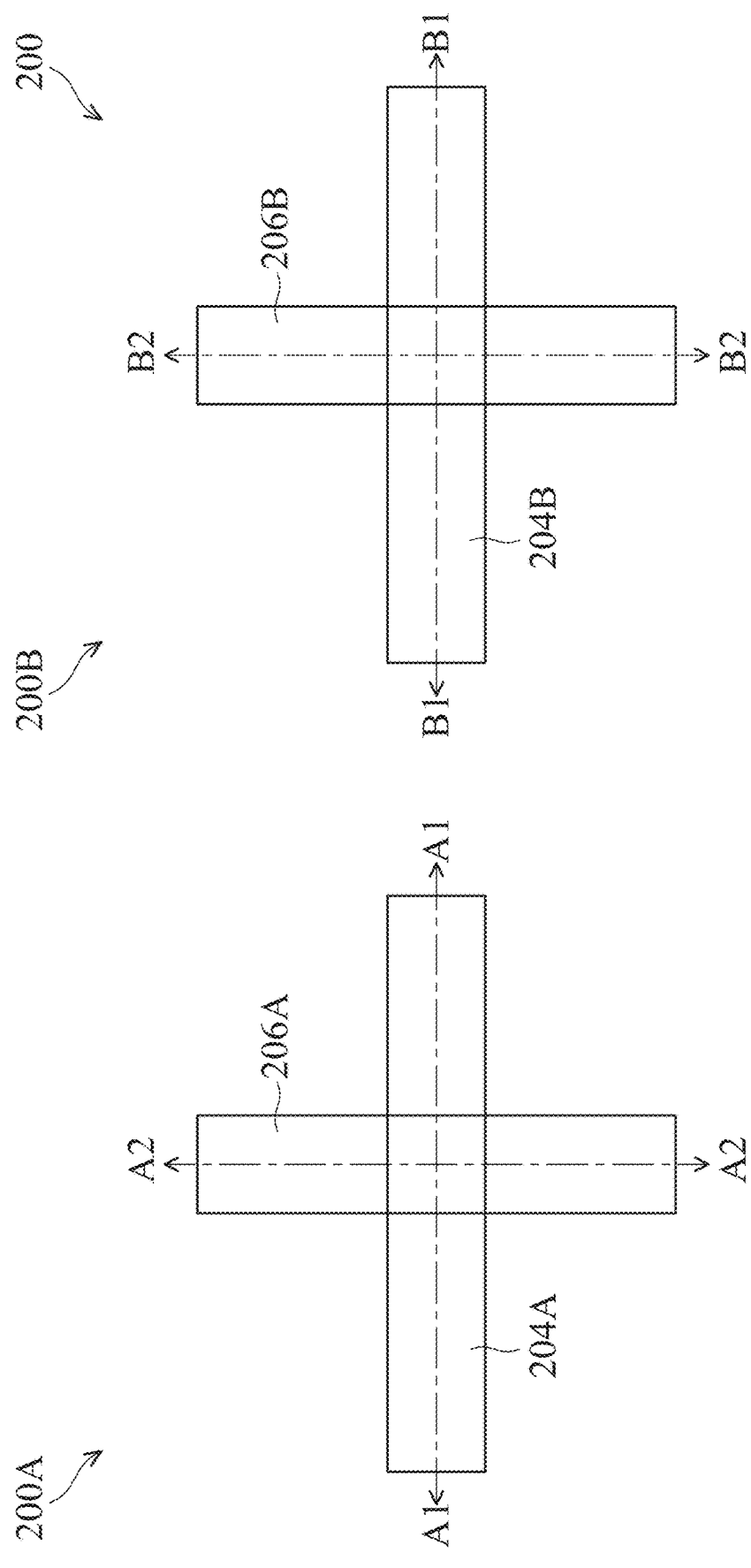
FIG. 3A is a diagrammatic top view of a semiconductor device, in portion, according to various aspects of the present disclosure.
Figure 16:
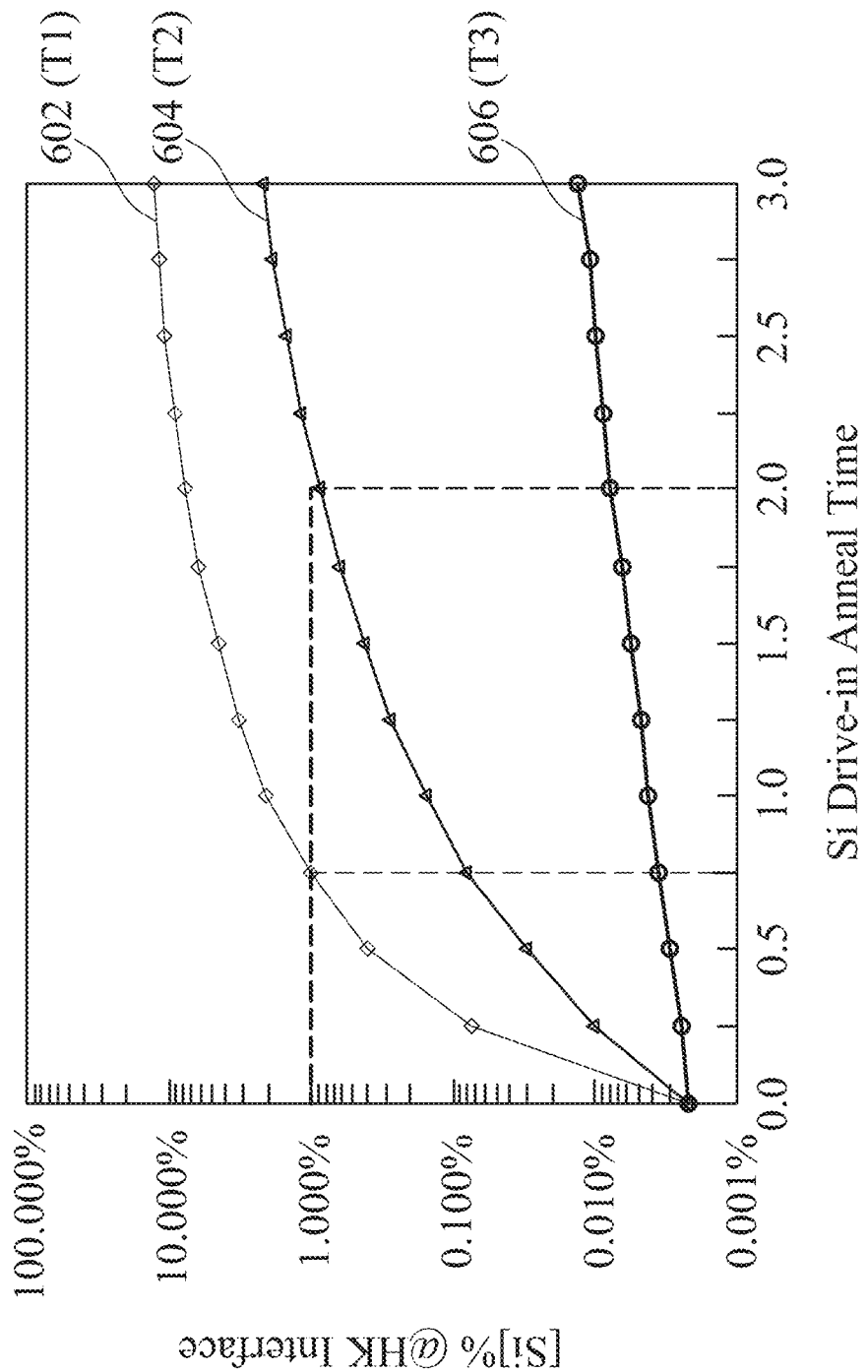
FIG. 16 illustrates experimental data showing the effects of silicon doping at different annealing temperatures as a function of time, according to aspects of the present disclosure.

FIG. 2 is a flow chart of a method 100 for fabricating a semiconductor device according to various aspects of the present disclosure. In some embodiments, the method 100 fabricates a multi-gate device 200 that includes a GAA transistor (or GAA FET) 200A and a GAA transistor (or GAA FET) 200B. In an embodiment, the GAA FET 200A is an NFET, and the GAA FET 200B is a PFET. In another embodiment, both the GAA FET 200A and the GAA FET 200B are NFET. In yet another embodiment, both the GAA FET 200A and the GAA FET 200B are PFET. Additional processing is contemplated by the present disclosure. Additional steps can be provided before, during, and after the method 100, and some of the steps described can be moved, replaced, or eliminated for additional embodiments of the method 100. The method 100 is described below in conjunction with FIGS. 3A through 16. FIG. 3A is a diagrammatic top view of the semiconductor device 200, in portion, at a fabrication stage associated with method 100 in FIG. 2 according to various aspects of the present disclosure. FIGS. 3B-15B are diagrammatic cross-sectional views of the device 200, in portion, at various fabrication stage associated with method 100 in FIG. 2 according to various aspects of the present disclosure. FIG. 16 illustrates some experimental data regarding the effects of an annealing process at certain operation of the method 100.

The device 200 is a multi-gate (or multigate) device in the present embodiments, and may be included in a microprocessor, a memory, and/or other IC device. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multi-gate device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. FIGS. 3A-15B have been simplified for the sake of clarity to better understand the inventive concepts of the present disclosure. Additional features can be added in the device 200, and some of the features described below can be replaced, modified, or eliminated in other embodiments of the device 200.

At the operation 102, the method 100 (FIG. 2) provides an initial structure of the device 200, a portion of which is shown in FIGS. 3A-3C. Particularly, FIG. 3A illustrates that the device 200 includes a FET 200A and a FET 200B at certain fabrication stage. The FET 200A includes an active region 204A and a gate region 206A generally perpendicular to the active region 204A. The active region 204A includes a pair of source/drain regions and a channel region between the pair of source/drain regions, and the gate region 206A engages the channel region in the active region 204A. Similarly, the FET 200B includes an active region 204B and a gate region 206B. The active region 204B includes a pair of source/drain regions and a channel region between the pair of source/drain regions, and the gate region 206B engages the channel region in the active region 204B.

FIG. 3B illustrate a cross-sectional view of the device 200 according to an embodiment, which can be a cross-sectional view of the FET 200A or the FET 200B along the A1-A1 or B1-B1 line of FIG. 3A, respectively. FIG. 3C illustrate a cross-sectional view of the device 200 according to an embodiment, which can be a cross-sectional view of the FET 200A or the FET 200B along the A2-A2 or B2-B2 line of FIG. 3A, respectively. The embodiments illustrated in FIGS. 3B and 3C are nanowire FETs, where their channel layers 215 are in the shape of nanowires. The FET 200A and 200B are illustrated as having the same configuration (for example, the same number of channel layers 215) for the sake of clarity to better understand the inventive concepts of the present disclosure. In various embodiments, the FET 200A and the FET 200B can have different configurations. For example, they may have different number of channel layers 215 and/or their channel layers 215 can be of different shapes or dimensions. For another example, either or both of the FETs 200A and 200B can be a FinFET, a nanowire FET, a nanosheet FET, or a planar FET.

Referring to FIGS. 3B-3C, the device 200 includes a substrate (e.g., a wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate.

Each of the transistors 200A and 200B further includes a pair of source/drain features 260. For NFET, the source/drain features 260 are of n-type. For PFET, the source/drain features 260 are of p-type. The source/drain features 260 may be formed by epitaxially growing semiconductor material(s) (e.g., Si or SiGe) to fill trenches in the device 200, for example, using CVD deposition techniques (e.g., Vapor Phase Epitaxy), molecular beam epitaxy, other suitable epitaxial growth processes, or combinations thereof. The source/drain features 260 are doped with proper n-type dopants and/or p-type dopants. For example, for NFET, the source/drain features 260 may include silicon and be doped with carbon, phosphorous, arsenic, other n-type dopant, or combinations thereof; and for PFET, the source/drain features 260 may include silicon germanium or germanium and be doped with boron, other p-type dopant, or combinations thereof.

Each of the transistors 200A and 200B further includes a stack of semiconductor layers 215 suspended over the substrate 202 and connecting the pair of the source/drain features 260. The stack of semiconductor layers 215 serve as the transistor channels for the respective transistor. Accordingly, the semiconductor layers 215 are also referred to as channel layers 215. The channel layers 215 are exposed in a gate trench 275 which is resulted from the removal of a dummy gate from the respective gate region 206A and 206B (FIG. 3A) therein. The channel layers 215 may include crystalline silicon, germanium, silicon germanium, or other suitable semiconductor materials. Initially, the channel layers 215 are formed as part of a semiconductor layer stack that includes the channel layers 215 and other semiconductor layers of a different material. The semiconductor layer stack is patterned into a shape of a fin protruding above the substrate 202 using one or more photolithography processes, including double-patterning or multi-patterning processes. After the gate trenches 275 are formed, the semiconductor layer stack is selectively etched to remove the other semiconductor layers, leaving the channel layers 215 suspended over the substrate 202 and between the respective source/drain features 260. The channel layers 215 are separated from each other and from the substrate 202 by gaps 277.

In some embodiments, each channel layer 215 has nanometer-sized dimensions. For example, each channel layer 215 may have a length (along the "x" direction) about 10 nm to about 300 nm, and a width (along the "y" direction) about 10 nm to about 80 nm, and a height (along the "z" direction) about 4 nm to about 8 nm in some embodiments. The vertical spacing (along the "z" direction) between the channel layers 215 may be about 6 nm to about 15 nm in some embodiments. Thus, the channel layer 215 can be referred to as a "nanowire," which generally refers to a channel layer suspended in a manner that will allow a metal gate to physically contact at least four sides of the channel layer (i.e., surround the channel layer). In some embodiments, the channel layers 215 may be cylindrical-shaped (e.g., nanowire), rectangular-shaped (e.g., nanobar), sheet-shaped (e.g., nanosheet), etc.), or have other suitable shapes.

The device 200 further includes isolation feature(s) 230 to isolate various regions, such as the various active regions 204A and 204B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. Isolation features 230 can include multiple layers of insulating materials.

The device 200 further includes gate spacers 247 adjacent to the source/drain features 260. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 247 include a multi-layer structure, such as a first dielectric layer that includes silicon nitride and a second dielectric layer that includes silicon oxide. The device 200 further includes inner spacers 255 vertically between adjacent channel layers 215 and adjacent to the source/drain features 260. Inner spacers 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 255 include a low-k dielectric material. The gate spacers 247 and the inner spacers 255 are formed by deposition (e.g., CVD, PVD, ALD, etc.) and etching processes (e.g., dry etching). The gate trenches 275 are provided between opposing gate spacers 247 and opposing inner spacers 255.

The device 200 further includes a contact etch stop layer (CESL) 268 disposed over the isolation features 230, the epitaxial source/drain features 260, and the gate spacers 247. The CESL 268 includes silicon and nitrogen, such as silicon nitride or silicon oxynitride. The CESL 268 may be formed by a deposition process, such as CVD, or other suitable methods. The device 200 further includes an inter-layer dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

FIGS. 3D and 3E illustrate cross-sectional views of the device 200 according to another embodiment, where the channel layer 215 is in the shape of a fin rather than multiple stacked layers. Thus, it is also referred to as a fin 215, and the transistors 200A and 200B as FinFETs. Particularly, FIG. 3D illustrates a cross-sectional view of the transistors 200A and 200B along the A1-A1 and B1-B1 lines of FIG. 3A, and FIG. 3E illustrates a cross-sectional view of the transistors 200A and 200B along the A2-A2 and B2-B2 lines of FIG. 3A. The fin 215 extends from the substrate 202 and through the isolation feature 230. The fin 215 connects the pair of source/drain features 260. The fin 215 may have a height (along the "z" direction) about 40 nm to about 70 nm and a width (along the "y" direction) about 4 nm to about 8 nm in some embodiments.

In the following discussion, the transistors 200A and 200B are nanowire FETs, such as illustrated in FIGS. 3B and 3C. However, they can also be FinFETs as illustrated in FIGS. 3D and 3E and the method 100 can be applied similarly to either embodiments, or to other types of transistors not illustrated in FIGS. 3B-3E.

Figure 4:
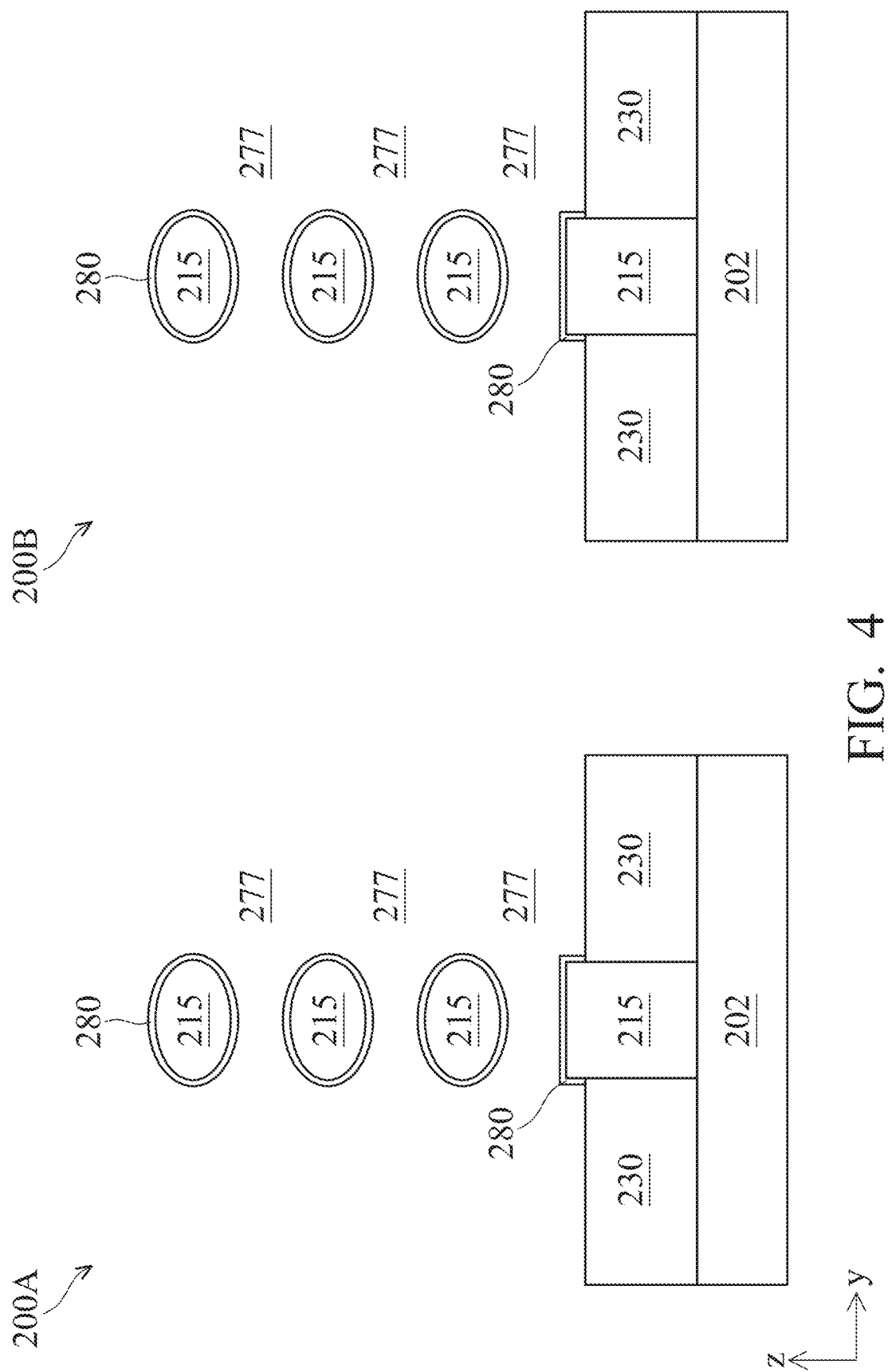
FIGS. 4, 5, 6, 7, 8, 9, 10, 11, 12, 13, 14, 15A, and 15B are diagrammatic cross-sectional views of the semiconductor device in FIG. 3A, in portion, at various fabrication stages (such as those associated with the method in FIG. 2) according to various aspects of the present disclosure.

At the operation 104, the method 100 (FIG. 2) forms an interfacial gate dielectric layer (or simply, interfacial layer) 280 over the channel layers 215, such as shown in FIG. 4, which illustrates cross-sectional views of the transistors 200A and 200B along the A2-A2 and B2-B2 lines of FIG. 3A, respectively. Turning to FIG. 4, in the depicted embodiment, the interfacial layer 280 is disposed on surfaces of the channel layers 215 and partially fills the gaps 277. In some embodiments, the interfacial layer 280 is also disposed on the substrate 202, the isolation features 230, and/or the gate spacers 247. The interfacial layer 280 includes a dielectric material, such as $SiO_2$, HfSiO, SiON, other silicon-containing dielectric material, other suitable dielectric material, or combinations thereof. The interfacial layer 280 is formed by any of the processes described herein, such as thermal oxidation, chemical oxidation, ALD, CVD, other suitable process, or combinations thereof. In some embodiments, the interfacial layer 280 has a thickness of about 0.5 nm to about 1.5 nm. In alternative embodiments, the operation 104 may be omitted and the interfacial layer 280 may be omitted in the transistors 200A and 200B.

Figure 5:
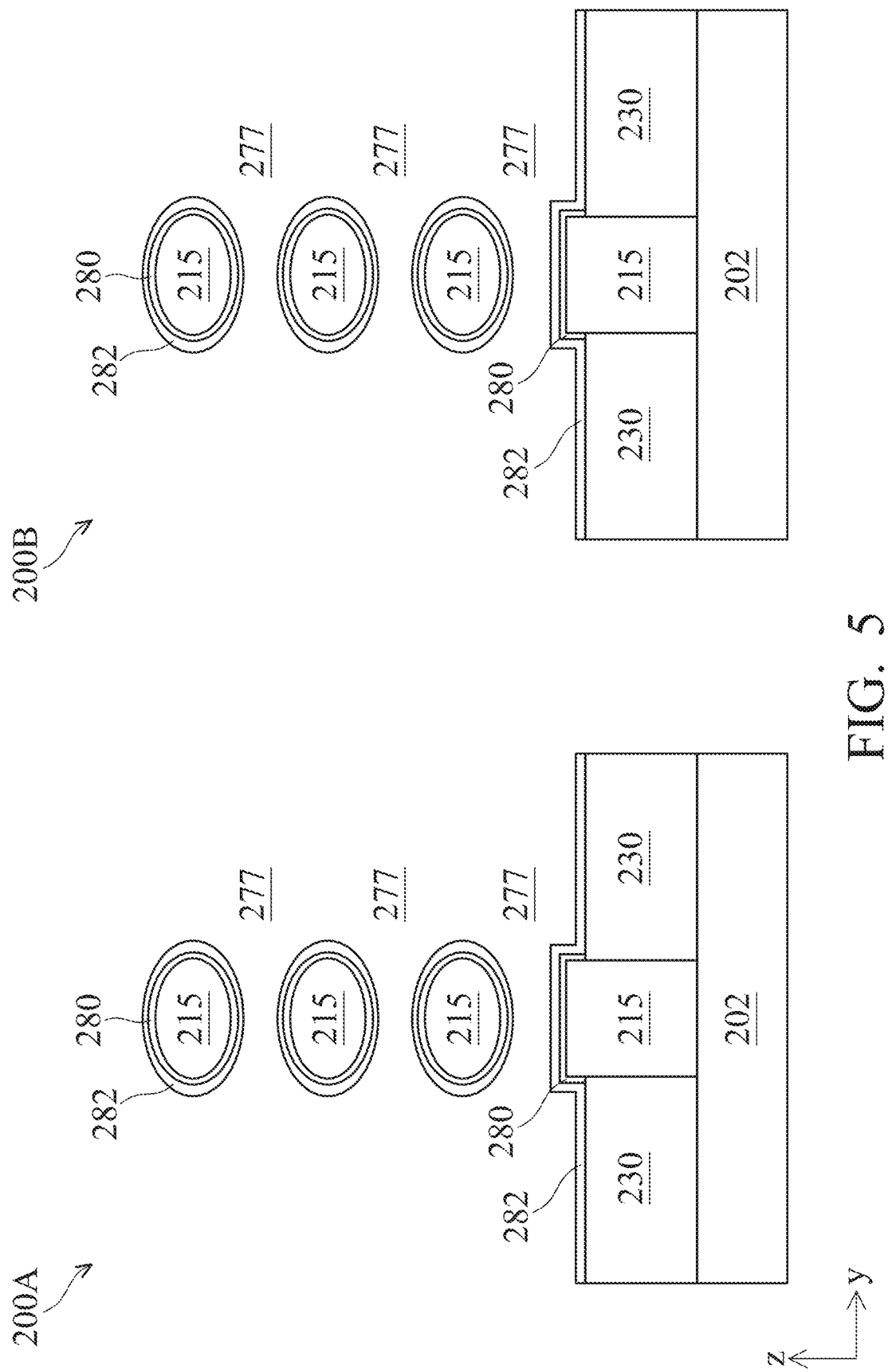

At the operation 106, the method 100 (FIG. 2) forms a high-k gate dielectric layer (or simply, high-k dielectric layer) 282 over the interfacial layer 280, such as shown in FIG. 5, which illustrates cross-sectional views of the transistors 200A and 200B along the A2-A2 and B2-B2 lines of FIG. 3A, respectively. Turning to FIG. 5, in the depicted embodiment, the high-k dielectric layer 282 is disposed over the interfacial layer 280 and the isolation features 230 and partially fills the gaps 277. The high-k dielectric layer 282 includes $HfO_2$ in an embodiment. In another embodiment, the high-k dielectric layer 282 includes another hafnium-containing high-k dielectric material, such as $HfSiO_4$, HfSiON (nitrided hafnium silicate), lanthanum hafnium oxide (such as $Hf_2La_2O_7$), HfTaO, HfTiO, HfZrO, hafnium-aluminum-oxide (i.e., $HfAlO_x$), or hafnium dioxide-alumina ($HfO_2$—$Al_2O_3$) alloy. In another embodiment, the high-k dielectric layer 282 includes another high-k dielectric material such as $ZrO_2$, $ZrSiO_4$, $Al_2SiO_5$, $Al_2O_3$, $TiO_2$, $La_2O_3$, $La_4Si_3O_{12}$, $Ta_2O_3$, $Ta_2O_5$, $Y_2O_3$, $SrTiO_3$, $BaZrO_3$, $BaTiO_3$ (BTO), $(Ba,Sr)TiO_3$ (BST), or combinations thereof. High-k dielectric material generally refers to dielectric materials having a high dielectric constant, for example, greater than 7.0. The high-k dielectric layer 282 is formed by any of the processes described herein, such as ALD, CVD, PVD, oxidation-based deposition process, other suitable process, or combinations thereof. In some embodiments, the high-k dielectric layer 282 has a thickness of about 0.2 nm to about 1.5 nm.

Figure 6:
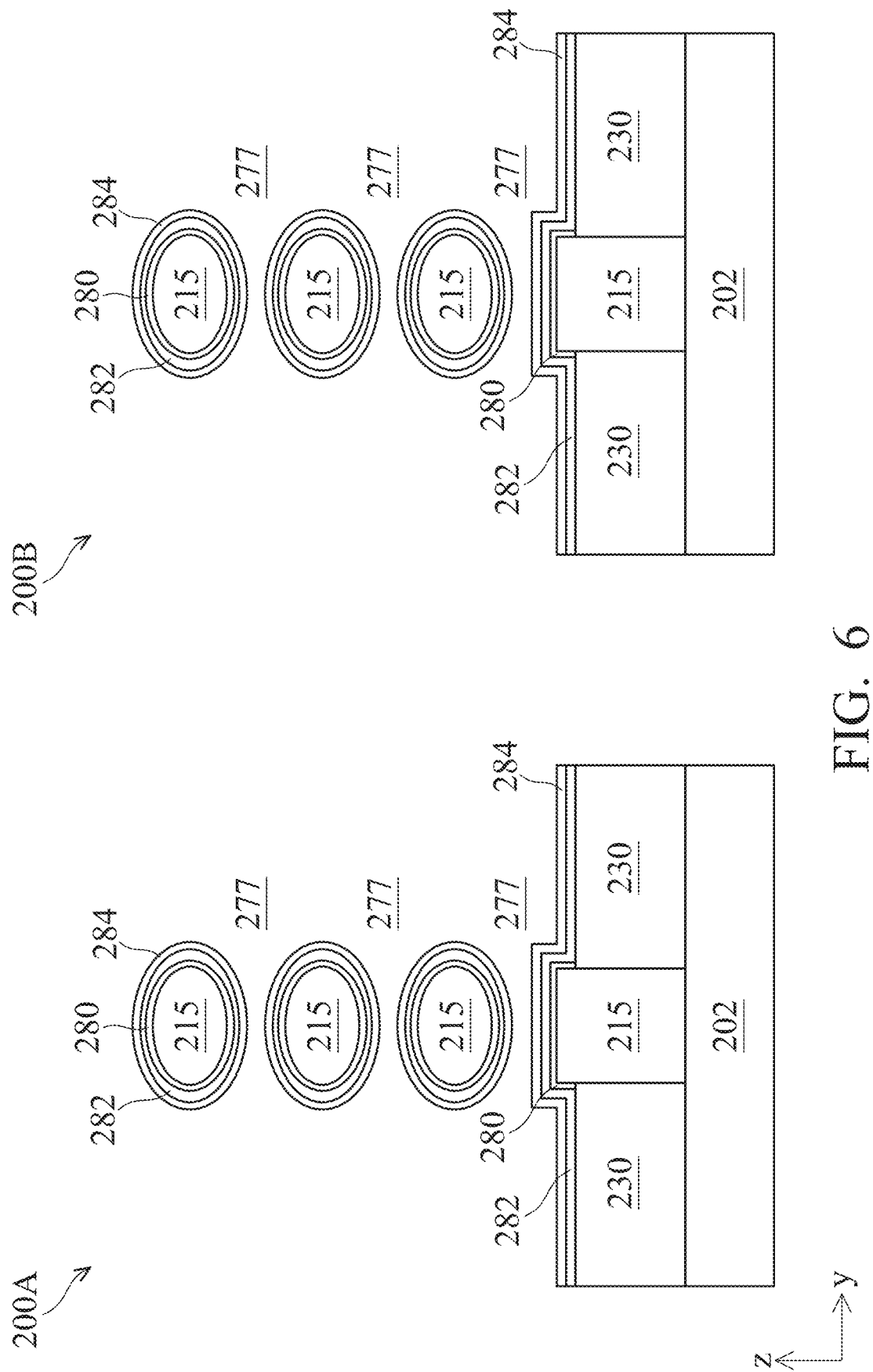

At the operation 108, the method 100 (FIG. 2) forms a work function metal (WFM) layer 284 over the high-k dielectric layer 282, such as shown in FIG. 6, which illustrates cross-sectional views of the transistors 200A and 200B along the A2-A2 and B2-B2 lines of FIG. 3A, respectively. Turning to FIG. 6, in the depicted embodiment, the WFM layer 284 is disposed over the high-k dielectric layer 282 and partially fills the gaps 277. In an embodiment, the WFM layer 284 includes TiN. In some embodiments, the WFM layer 284 includes another nitride-based metallic material, such as TaN, WN, TiCN, TaCN, WCN, TiAlN, or TaAlN. In some embodiments, the WFM layer 284 may include TiAlC, TiAlSiC, TaC, TaAl, TaAlC, TaSiAlC, or other suitable work function metal. In the present embodiment, the WFM layer 284 has a thickness of about 1 nm to about 2.5 nm, such as from about 1 nm to about 1.5 nm. If the WFM layer 284 is too thick (such as more than 2.5 nm), it may fill the gaps 277 in some embodiments and the subsequent silicon doping of the WFM layer 284 would not be uniform. If the WFM layer 284 is too thin (such as less than 1 nm), it might not provide the desired effective work function (eWF) or the eWF tuning by silicon doping might not be effective. The WFM layer 284 is formed by any of the processes described herein, such as ALD, CVD, PVD, other suitable process, or combinations thereof. In an embodiment, the WFM layer 284 is formed by ALD, such as ALD TiN.

Figure 7:
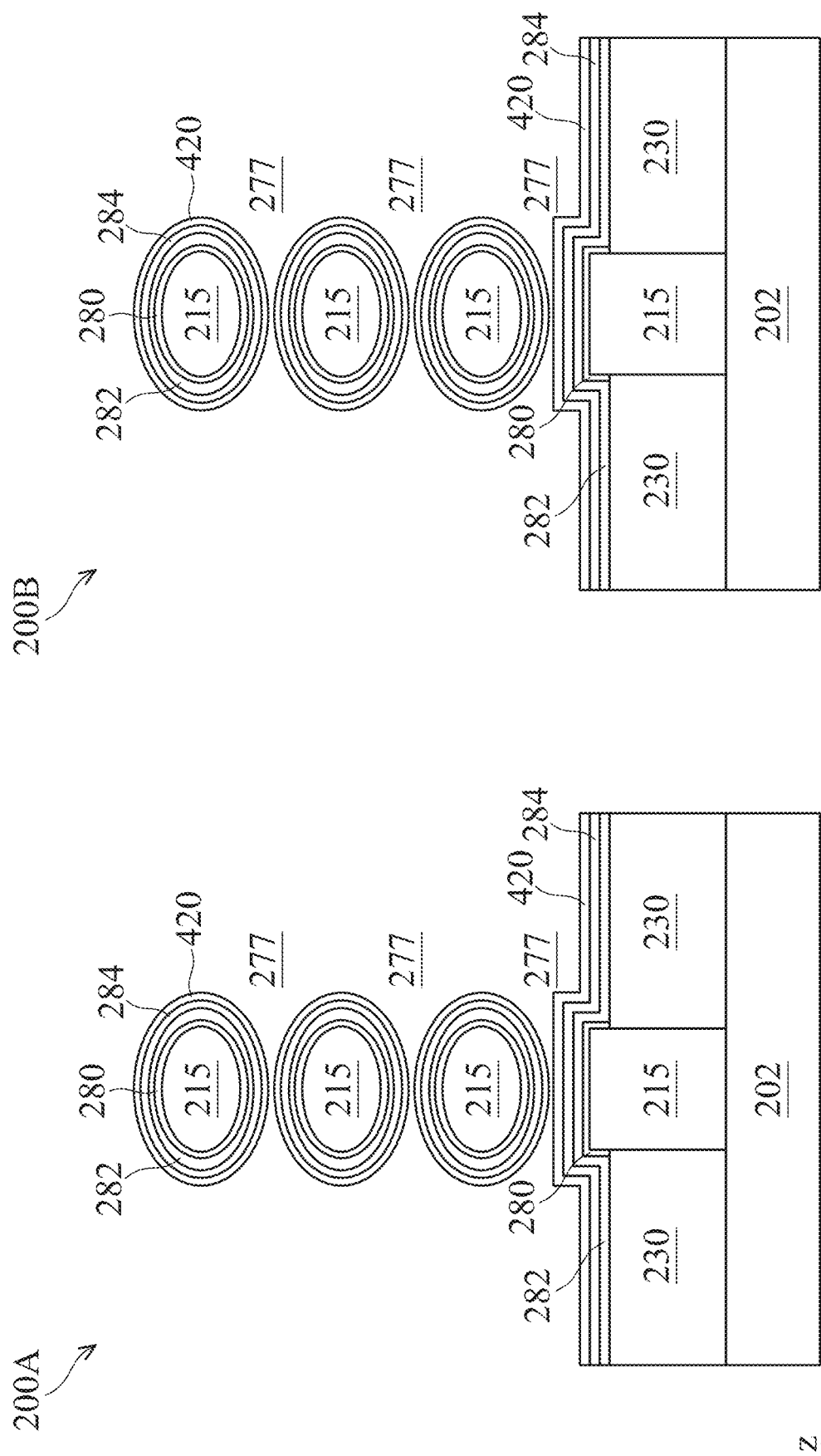

At the operation 110, the method 100 (FIG. 2) forms a silicide layer 420 over the WFM layer 284, such as shown in FIG. 7, which illustrates cross-sectional views of the transistors 200A and 200B along the A2-A2 and B2-B2 lines of FIG. 3A, respectively. Turning to FIG. 7, in the depicted embodiment, the silicide layer 420 is disposed over the WFM layer 284 and surrounds the WFM layer 284. In an embodiment, the silicide layer 420 partially fills the gaps 277. Alternatively, the silicide layer 420 completely fills the gaps 277. In an embodiment, the silicide layer 420 includes any phase or variation of titanium silicide including $TiSi_2$, any phase or variation of zirconium silicide including $ZrSi_2$, any phase or variation of yttrium silicide including $YSi_2$, or other suitable silicide. In the present embodiment, the silicide layer 420 is deposited to a thickness of about 1 nm to about 3 nm, such as from about 1 nm to about 1.5 nm. The silicide layer 420 is formed by any of the processes described herein, such as ALD, CVD, PVD, other suitable process, or combinations thereof. For example, titanium disilicide ($TiSi_2$) can be deposited using ALD with precursors $TiCl_4$ and silane.

At the operation 112, the method 100 (FIG. 2) patterns the silicide layer 420 such that it is removed from the transistor 200B (in this embodiment, the WFM layer 284 in the transistor 200B is not doped with silicon) and it remains over the transistor 200A. This involves multiple processes including photolithography and etching processes, as will be described below.

Figure 8:
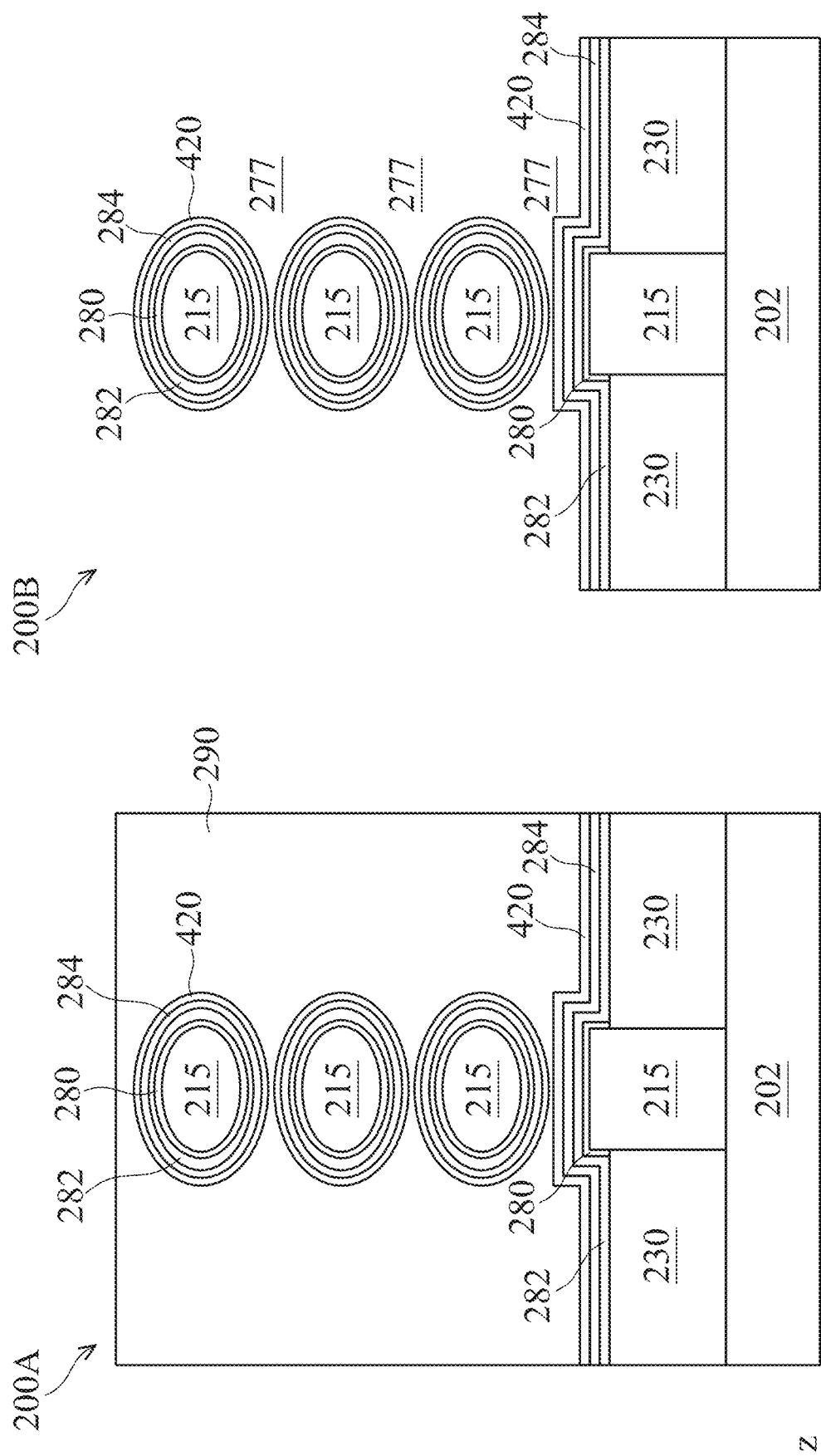

Turning to FIG. 8, the method 100 forms an etch mask 290 that covers the transistor 200A and exposes the transistors 200B. The mask 290 includes a material that is different than a material of the silicide layer 420 and the WFM layer 284 to achieve etching selectivity during the etching of the silicide layer 420 and during the removal of the etch mask 290. For example, the mask 290 may include a resist material (and thus may be referred to as a patterned resist layer and/or a patterned photoresist layer). In some embodiments, the mask 290 has a multi-layer structure, such as a resist layer disposed over an anti-reflective coating (ARC) layer. The present disclosure contemplates other materials for the mask 290, so long as the above etching selectivity is achieved. In some embodiments, the operation 112 includes a lithography process that includes forming a resist layer over the device 200 (e.g., by spin coating), performing a pre-exposure baking process, performing an exposure process using a photomask, performing a post-exposure baking process, and developing the exposed resist layer in a developer solution. After development, the patterned resist layer (e.g., patterned mask 290) includes a resist pattern that corresponds with the photomask, where the patterned resist layer covers the transistor 200A and exposes the transistor 200B. Alternatively, the exposure process can be implemented or replaced by other methods, such as maskless lithography, e-beam writing, ion-beam writing, or combinations thereof.

Figure 9:
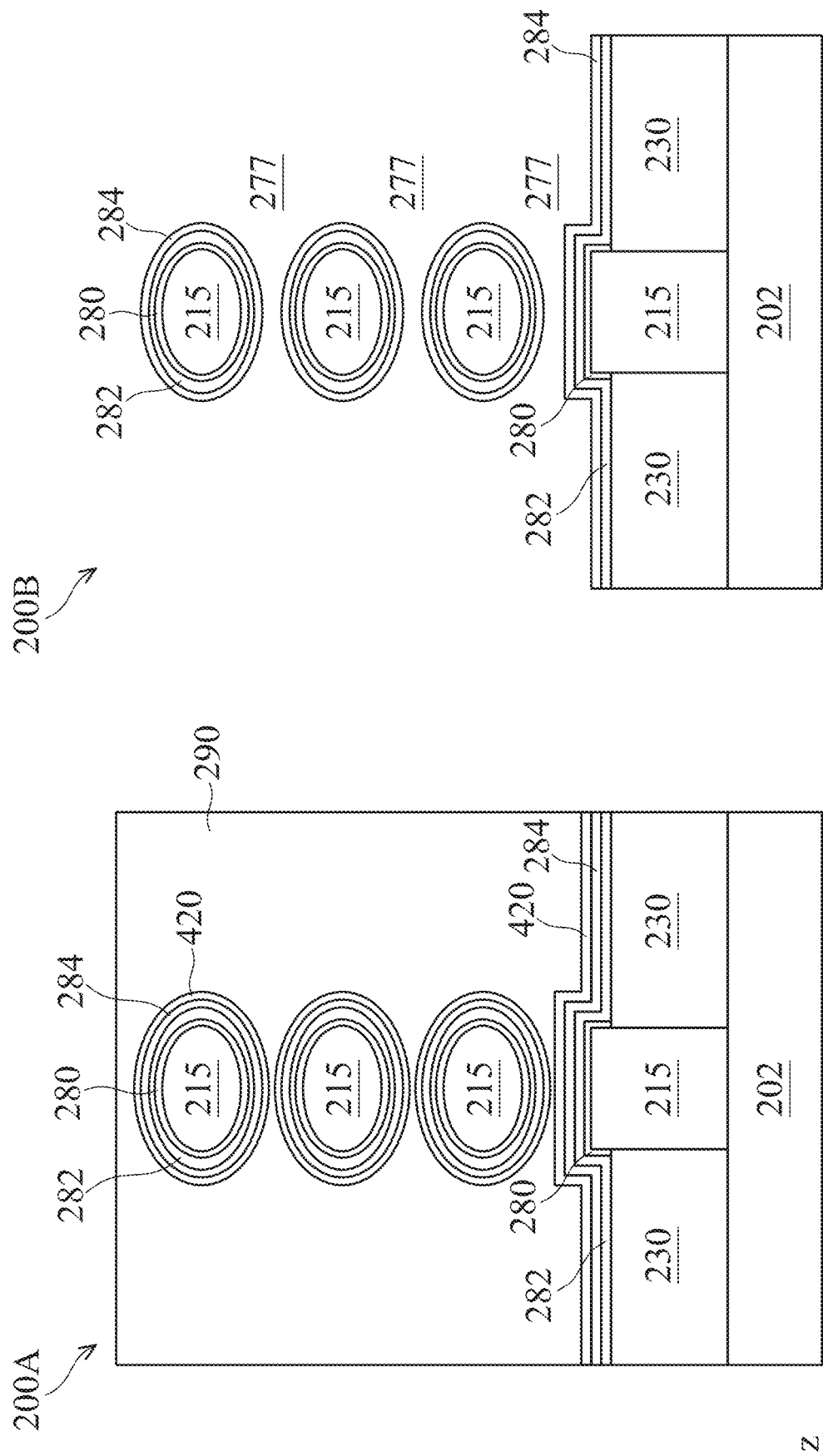

With the etch mask 290 in place, the operation 112 then etches the silicide layer 420 and removes it from the transistor 200B, such as shown in FIG. 9. The silicide layer 420 in the transistor 200A is protected by the etch mask 290 from the etching process. The etching process completely removes the silicide layer 420 around the channel layers 215 and between the channel layers 215 and the substrate 202 in the transistor 200B, thereby exposing the WFM layer 284 therein. The etching process can be a dry etching process, a wet etching process, or a reactive ion etching process that has a high etching selectivity with respect to the silicide layer 420 relative to the WFM layer 284. In some embodiments, the etching solution further has an etching selectivity with respect to silicide layer 420 relative to the mask 290. In some embodiments, the etching process partially etches the mask 290.

Figure 10:
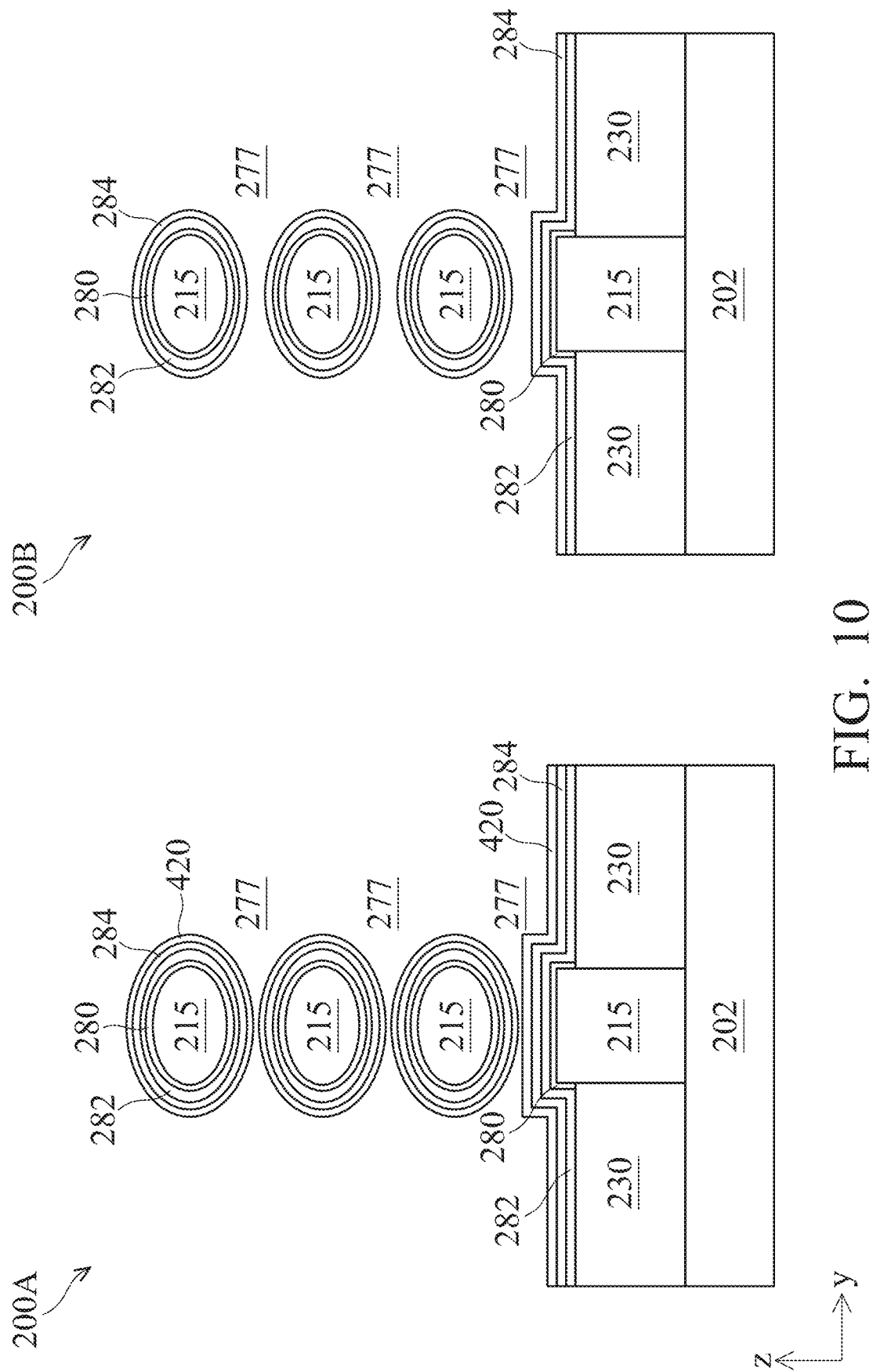
Figure 11:
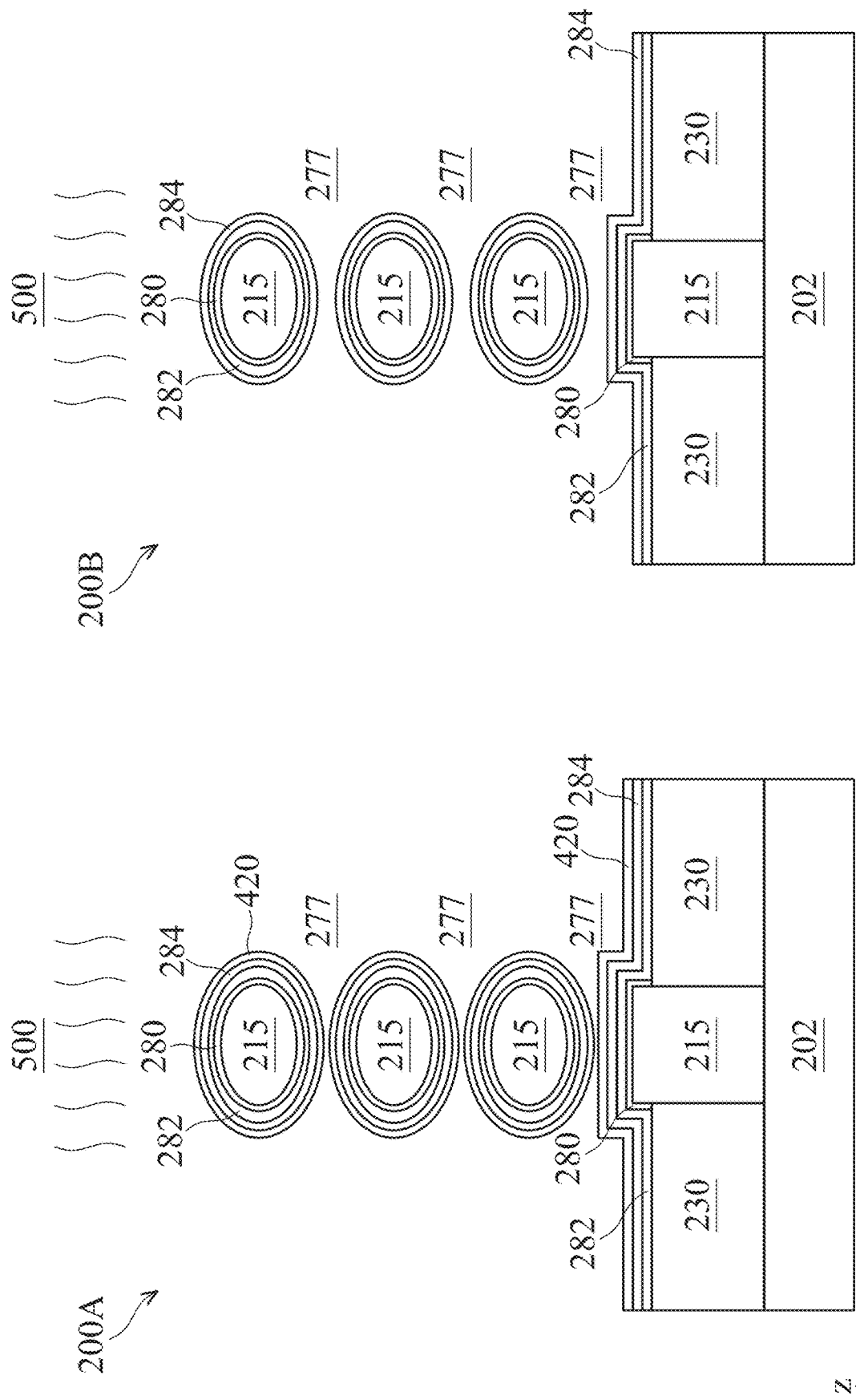

After the etching process completes, the mask 290 is removed, for example, by a resist stripping process or other suitable process at the operation 112 of the method 100 (FIG. 2). Turning to FIG. 10, only the portion of the silicide layer 420 in the transistor 200A still remains. The silicide layer 420 is removed from the transistor 200B.

At operation 114, the method 100 (FIG. 2) performs a thermal drive-in process 500 (FIG. 11) to the device 200 so that silicon elements from the silicide layer 420 are driven into the WFM layer 284, particularly in the portion of the WFM layer 284 that interfaces with the high-k dielectric layer 282 of the transistor 200A. This portion of the WFM layer 284 is referred to as the portion 284', which is about 2 Å to 4 Å thick in an embodiment. The inventors of the present disclosure have discovered that silicon elements can be stably located in the portion 284', for example by bonding with nitrogen atoms in the WFM layer 284 and/or oxygen atoms in the high-k dielectric layer 282. In an example where the high-k dielectric layer 282 includes $HfO_2$ and the WFM layer 284 include TiN, the silicon elements can replace some of the Ti elements in the TiN layers, creating silicon doped TiN. Similarly, silicon can be doped into other WFM materials. The inventors of the present disclosure have also discovered that the amount of eWF tuning (or reduction) is approximately proportional to the amount of silicon doping in the portion 284'. For example, for every 1% of silicon doping (for example, every 1 out of 100 titanium atoms is replaced by silicon), the dipole is about −0.023 eÅ and the eWF can be reduced by about 55 mV. Thus, by controlling the silicon doping concentration in the portion 284', a desired eWF reduction can be achieved. The silicon doping concentration in the portion 284' can be controlled by using the annealing process 500 in the operation 114. For example, by annealing at an appropriate temperature and for appropriate duration, a target silicon doping concentration can be reached. FIG. 16 shows experimental data about silicon doping concentration in the portion 284' as a function of time and temperature, where graphs 602, 604, and 606 are obtained at three different annealing temperatures $T_1$, $T_2$, and $T_3$ respectively. The temperature $T_1$ is in a range of about 570° C. to 585° C., the temperature $T_2$ is in a range of about 545° C. to 560° C., and the temperature $T_3$ is in a range of about 490° C. to 500° C. When the annealing temperature is higher, the silicon's diffusivity is higher, and silicon is doped faster into the WFM layer 284. For example, at the annealing temperature $T_1$, the silicon doping concentration in TiN can reach 1% in about 45 seconds and 10% in about 150 seconds. For example, at the annealing temperature $T_2$, the silicon doping concentration in TiN can reach 1% in about 120 seconds. In embodiments, the portion 284' is doped with silicon with a silicon dopant concentration in a range of about 1% to about 10%, which provides eWF tuning (or reduction) in a range from about 55 mV to about 550 mV. The annealing temperature can be selected in a range from about 550° C. to about 600° C. in some embodiments. If the annealing temperature is too low (such as less than 550° C.), the eWF tuning range may be too small to create a noticeable effect, and/or the annealing duration may be too long, which adds manufacturing costs. If the annealing temperature is too high (such as more than 600° C.), some existing structure of the transistors 200A and 200B may be damaged by the annealing process 500. Since there is no silicide layer 420 on the WFM layer 284 in the transistor 200B, the WFM layer 284 in the transistor 200B is not doped with silicon during the annealing process 500.

Figure 12:
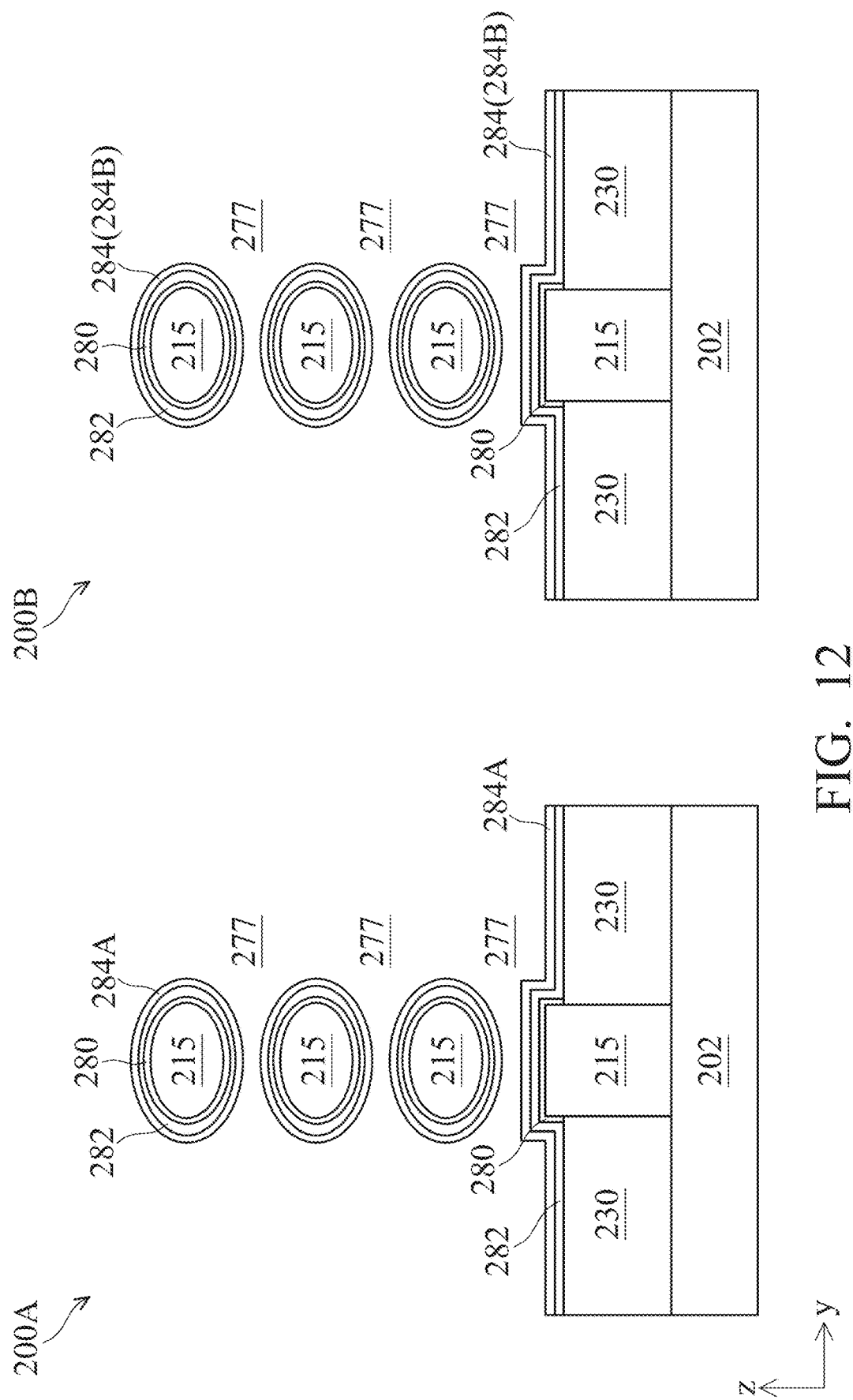

At operation 116, the method 100 (FIG. 2) removes the silicide layer 420 from the device 200 by applying one or more etching processes. The resultant structure is shown in FIG. 12. The etching process can be a dry etching process, a wet etching process, a reactive ion etching process, or another etching process and has a high etching selectivity with respect to the silicide layer 420 relative to the WFM layer 284. Because the WFM layer 284 in the transistor 200A has been doped with silicon, it is also referred to as the WFM layer 284A, while the WFM layer 284 in the transistor 200B may also be referred to as the WFM layer 284B. The WFM layer 284A includes a portion 284' that interfaces with the high-k dielectric layer 282 and another portion 284" above the portion 284', as shown in FIG. 1. In an embodiment, the portion 284" is not doped with silicon. In another embodiment, the portion 284" is doped with silicon with a silicon dopant concentration much lower than that in the portion 284'. For example, the silicon dopant concentration in the portion 284" may be 10 times lower than that in the portion 284' in an embodiment. In an embodiment, the silicon dopant concentration in the portion 284" is 0.1% or lower, 0.01% or lower, or 0.001% or lower. In some embodiment, the silicon dopant concentration in the portion 284" is in a range of about 0.001% to about 0.1%. Portions of the gaps 277 are reclaimed. In other words, the WFM layer 284A on adjacent channel layers 215 of the transistor 200A are spaced by the gap 277, and the WFM layer 284B on adjacent channel layers 215 of the transistor 200B are spaced by the gap 277.

Figure 13:
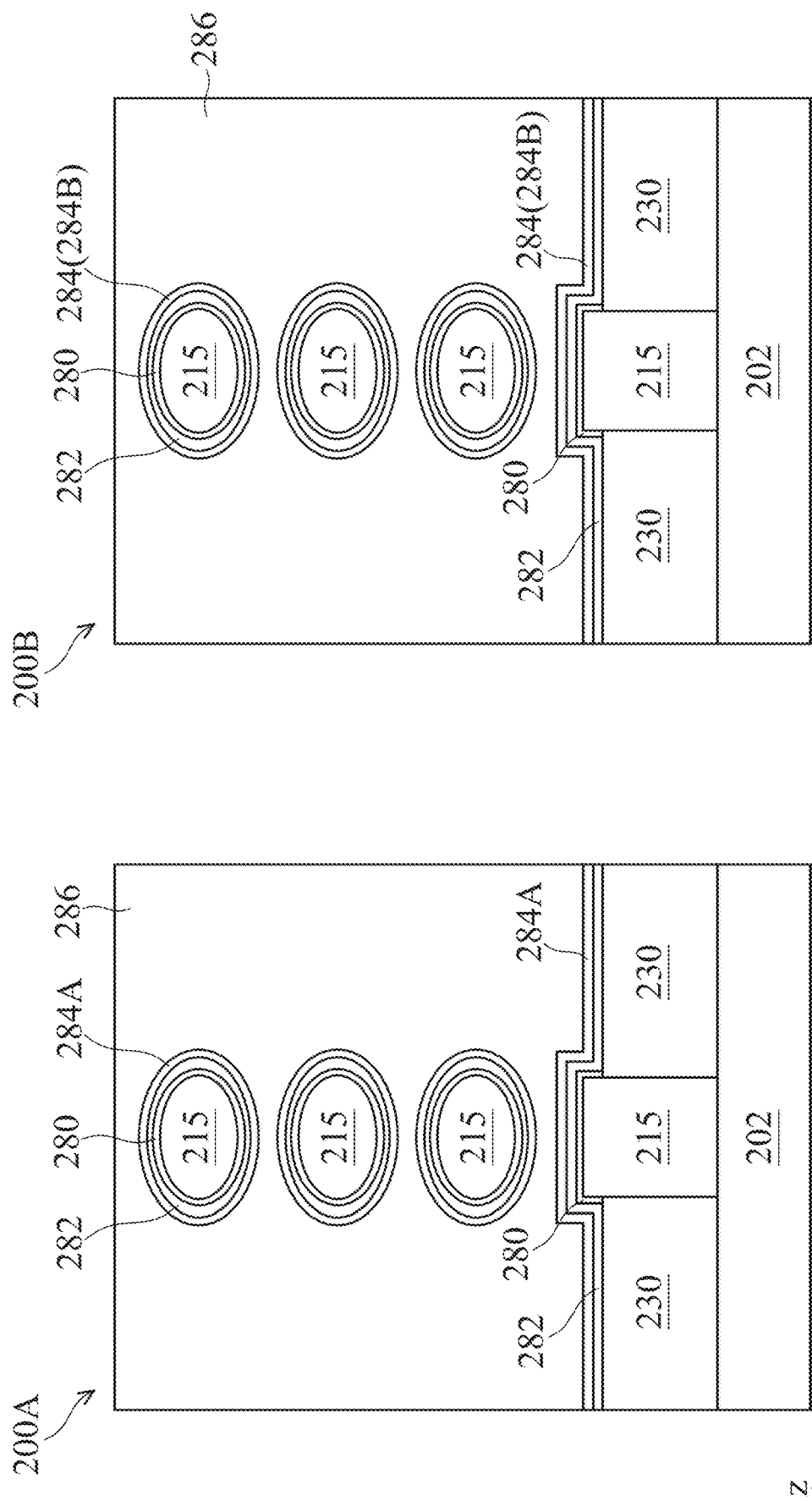
Figure 14:
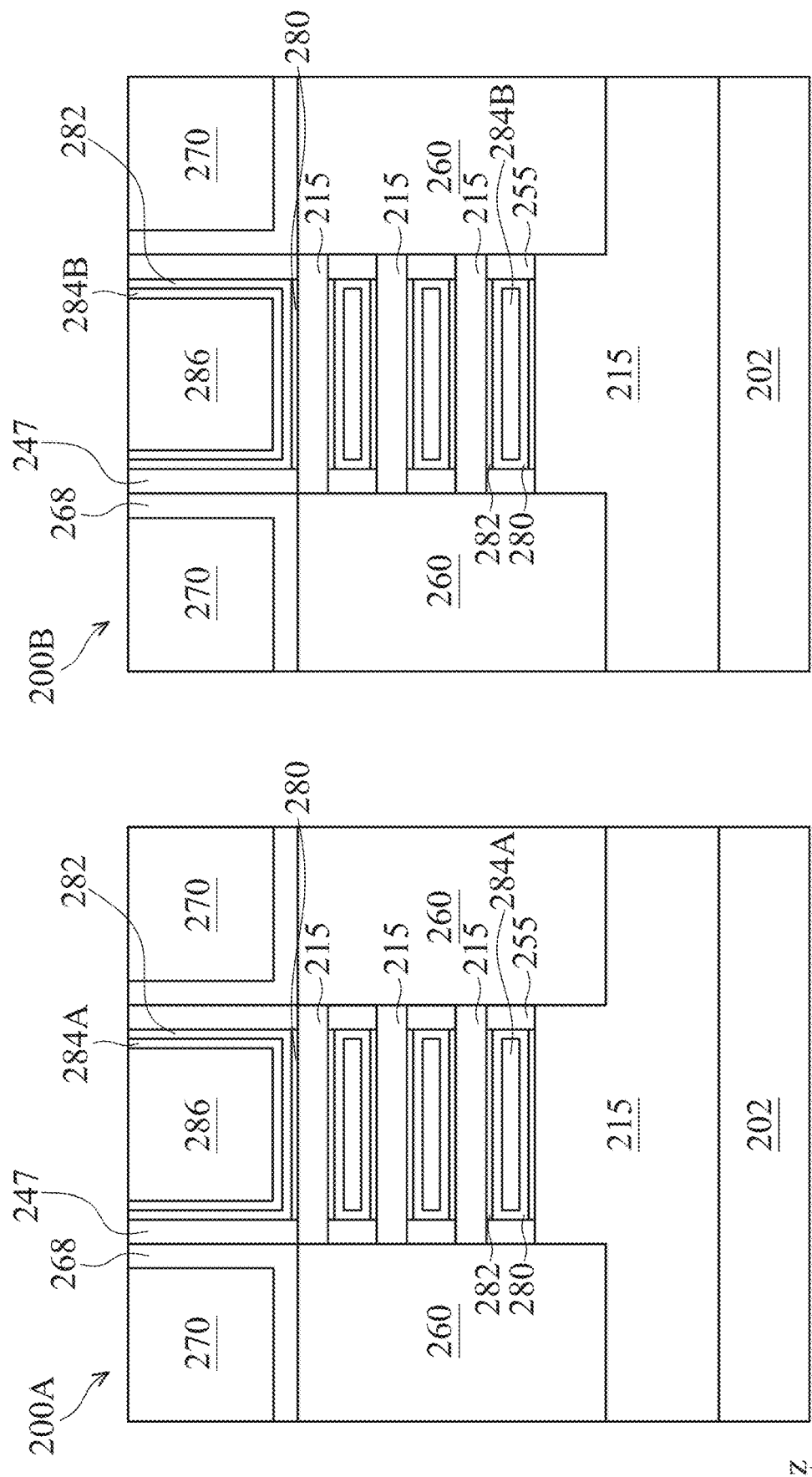
Figure 15:
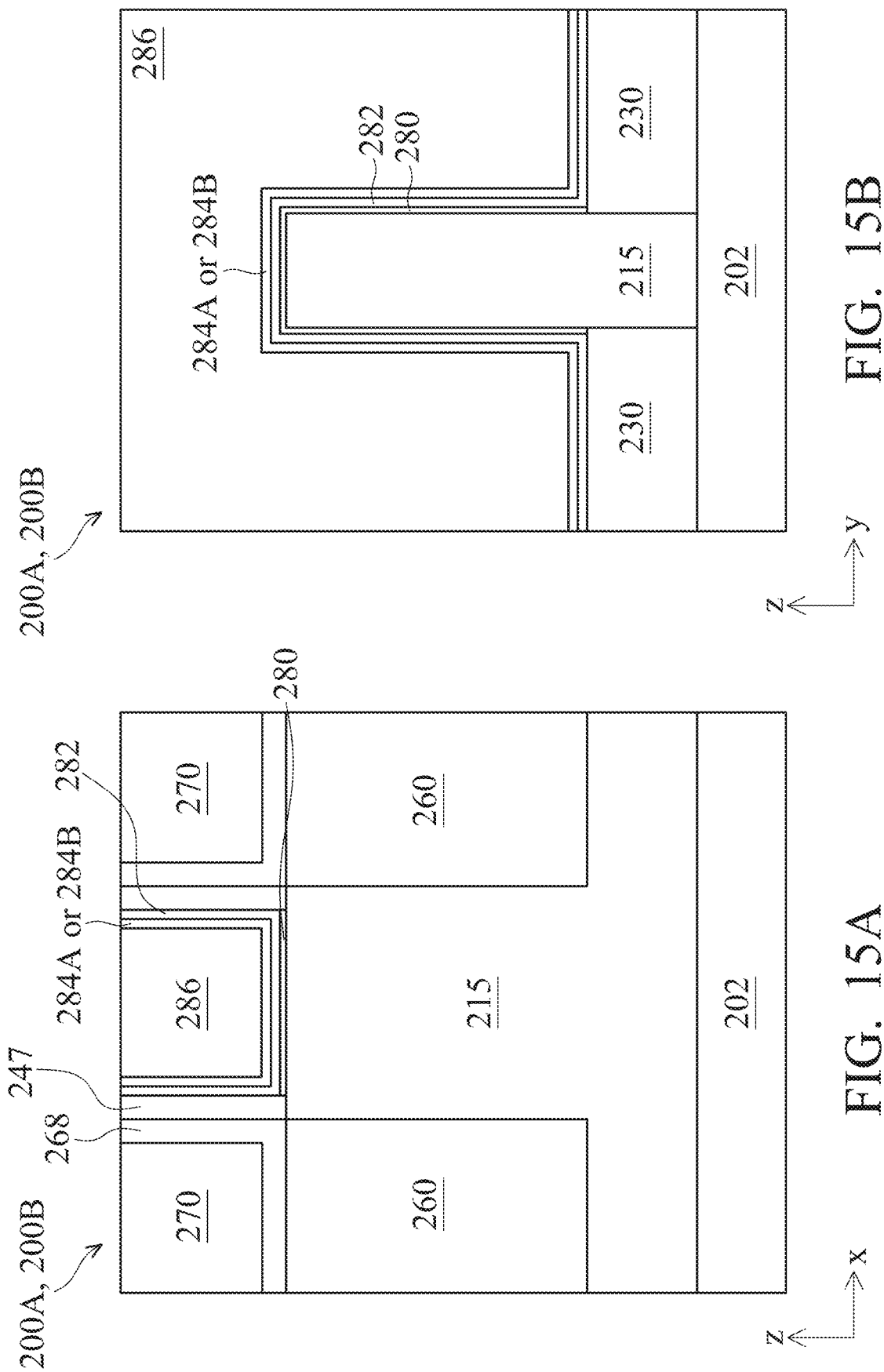

At operation 118, the method 100 (FIG. 2) forms a bulk metal layer 286 over the WMF layers 284A and 284B, such as shown in FIGS. 13 and 14. FIG. 13 illustrates the transistors 200A and 200B along the A2-A2 and B2-B2 lines of FIG. 3A, respectively, at this fabrication stage; and FIG. 14 illustrates the transistors 200A and 200B along the A1-A1 and B1-B1 lines of FIG. 3A, respectively, at this fabrication stage. For example, a CVD process or a PVD process deposits the bulk metal layer 286, such that it fills any remaining portion of gate trenches 275 (see FIGS. 3B and 3C). The bulk metal layer 286 includes a suitable conductive material, such as Al, W, and/or Cu. The bulk metal layer 286 may additionally or collectively include other metals, metal oxides, metal nitrides, other suitable materials, or combinations thereof. In some implementations, a blocking layer (not shown) is optionally formed (e.g., by ALD) over the WFM layer 284A and 284B before forming the bulk metal layer 286, such that the bulk metal layer 286 is disposed on the blocking layer. After the bulk metal layer 286 is deposited, a planarization process may then be performed to remove excess gate materials from the device 200. For example, a CMP process is performed until a top surface of ILD layer 270 is reached (exposed).

At operation 120, the method 100 (FIG. 2) performs further fabrications such as forming S/D contacts that electrically connect to the S/D features 260, forming gate vias that electrically connect to the bulk metal layer 286, and forming multi-layer interconnects that connect the transistors 200A and 200B to various parts of the device 200 to form a complete IC.

FIGS. 15A and 15B illustrate the transistors 200A and 200B, in portion, in an alternative embodiment where the transistors 200A and 200B are FinFETs. FIG. 15A illustrates the FinFET 200A and 200B along the A1-A1 and B1-B1 lines of FIG. 3A, respectively, and FIG. 15B illustrates the FinFETs 200A and 200B along the A2-A2 and B2-B2 lines of FIG. 3A, respectively. As illustrated, the interfacial layer 280, the high-k dielectric layer 282, and the WFM layers 284A and 284B are disposed over the top and sidewalls of the fin 215.

Although not intended to be limiting, one or more embodiments of the present disclosure provide many benefits to a semiconductor device and the formation thereof. For example, embodiments of the present disclosure provide methods for doping silicon into an interface between a work function metal layer and a high-k dielectric layer to create dipole effects. The dipole effects can reduce the effective work function of a gate stack very efficiently. Using the present disclosure, the work function metal layer can be made very thin, which is highly desirable for making advanced multi-gate transistors. The present embodiments can be readily integrated into existing CMOS fabrication processes.

In one example aspect, the present disclosure is directed to a method. The method includes providing a structure having a substrate and a channel layer over the substrate; forming a high-k gate dielectric layer over the channel layer; forming a work function metal layer over the high-k gate dielectric layer; forming a silicide layer over the work function metal layer; annealing the structure such that a first portion of the work function metal layer that interfaces with the high-k gate dielectric layer is doped with silicon elements from the silicide layer; removing the silicide layer; and forming a bulk metal layer over the work function metal layer.

In an embodiment, the method further includes forming an interfacial gate dielectric layer over the channel layer, wherein the high-k gate dielectric layer is formed over the interfacial gate dielectric layer. In some embodiments of the method, the silicide layer includes titanium silicide, zirconium silicide, or yttrium silicide. In some embodiments, the work function metal layer has a thickness in a range of about 1 nm to about 1.5 nm.

In an embodiment of the method, the annealing is performed in a temperature in a range of about 550° C. to 600° C. In a further embodiment, the temperature of the annealing and duration of the annealing are controlled such that about 1% to about 10% of the first portion of the work function metal layer is doped with Si.

In an embodiment of the method, the work function metal layer includes a nitride-based metallic material. In a further embodiment, the work function metal layer includes TiN, TaN, WN, TiCN, TaCN, WCN, TiAlN, or TaAlN. In some embodiments, the work function metal layer includes TiN, the high-k gate dielectric layer includes $HfO_2$, and the silicide layer includes titanium silicide, zirconium silicide, or yttrium silicide.

In another example aspect, the present disclosure is directed to a method. The method includes providing a structure having a substrate and first and second semiconductor channel layers over the substrate; depositing a high-k gate dielectric layer over both the first and the second semiconductor channel layers; forming a work function metal layer over the high-k gate dielectric layer and over both the first and the second semiconductor channel layers; forming a silicide layer over the work function metal layer and over both the first and the second semiconductor channel layers; patterning the silicide layer such that a first portion of the silicide layer remains over the first semiconductor channel and a second portion of the silicide layer over the second semiconductor channel is removed; annealing the structure such that silicon elements from the silicide layer are driven into a portion of the work function metal layer that interfaces with the high-k gate dielectric layer; and removing the first portion of the silicide layer.

In an embodiment of the method, the silicide layer includes titanium silicide, zirconium silicide, or yttrium silicide, the work function metal layer includes a nitride-based metallic material, and the high-k gate dielectric layer includes a hafnium-based dielectric material.

In some embodiments, after the removing of the first portion of the silicide layer, the method further includes depositing a bulk metal layer over the work function metal layer and over both the first and the second semiconductor channel layers.

In an embodiment, the work function metal layer has a thickness in a range of about 1 nm to about 1.5 nm. In another embodiment, the annealing is performed in a temperature in a range of about 550° C. to 600° C. In some embodiments, the patterning of the silicide layer includes forming an etch mask that covers the first portion of the silicide layer and exposes the second portion of the silicide layer; etching the second portion of the silicide layer; and after the etching of the second portion of the silicide layer, removing the etch mask.

In yet another example aspect, the present disclosure is directed to a semiconductor structure. The semiconductor structure includes a substrate; a first semiconductor channel layer over the substrate; a high-k gate dielectric layer over the first semiconductor channel layer; a work function metal layer over the high-k gate dielectric layer, wherein a first portion of the work function metal layer that interfaces with the high-k gate dielectric layer is doped with silicon at a first dopant concentration; and a bulk metal layer over the work function metal layer and interfacing with a second portion of the work function metal layer that is not doped with silicon or is doped with silicon at a second dopant concentration lower than the first dopant concentration, wherein the bulk metal layer and the first and the second portions of the work function metal layer form at least a part of a first gate electrode.

In an embodiment, the semiconductor structure further includes a second semiconductor channel layer over the substrate, wherein the high-k gate dielectric layer, the work function metal layer, and the bulk metal layer are also disposed over the second semiconductor channel layer, wherein a third portion of the work function metal layer that is disposed over the second semiconductor channel layer is not doped with silicon.

In some embodiments, the second dopant concentration is at least 10 times smaller than the first dopant concentration. In a further embodiment, the first dopant concentration is in a range of 1% to 10%. In some embodiments, the work function metal layer includes a nitride-based metallic material, and the high-k gate dielectric layer includes a hafnium-based dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a plurality of channel components arranged in a vertical stack in a cross-sectional side view, wherein each of the channel components is spaced apart vertically from other channel components in the cross-sectional side view;
a plurality of gate dielectric components that circumferentially surround the plurality of channel components in the cross-sectional side view, respectively; and
a plurality of work function metal components that circumferentially surround the plurality of gate dielectric components and the plurality of channel components in the cross-sectional side view, respectively;
wherein:
the work function metal components each contains a dopant; and
within each of the work function metal components, a concentration of the dopant varies as a function of a proximity with the respective channel component encircled by the work function metal component.

2. The device of claim 1, further comprising a plurality of interfacial layers that encircle the plurality of channel components in the cross-sectional side view, respectively, wherein the plurality of interfacial layers are encircled by the plurality of gate dielectric components in the cross-sectional side view, respectively.

3. The device of claim 2, wherein:
inner surfaces of the interfacial layers are in direct contact with the channel components; and
outer surfaces of the interfacial layers are in direct contact with the gate dielectric components.

4. The device of claim 1, further comprising a bulk metal component circumferentially surrounds the plurality of work function metal components, the plurality of gate dielectric components, and the plurality of channel components in the cross-sectional side view.

5. The device of claim 4, where an inner surface of the bulk metal component is in direct contact with outer surfaces of the work function metal components.

6. The device of claim 1, wherein the dopant is a semiconductor material.

7. The device of claim 6, wherein the dopant is silicon.

8. The device of claim 1, wherein for each of the work function metal components and the respective channel component circumferentially surrounded therewithin:
the work function metal component has a first concentration of the dopant at a first position and a second concentration of the dopant at a second position;
the first concentration is greater than the second concentration; and
the first position is located closer to the channel component encircled by the work function metal component than the second position.

9. The device of claim 8, wherein the first concentration is at least ten times greater than the second concentration.

10. The device of claim 1, wherein for each of the work function metal components, the dopant is not present at portions of the work function metal component at or near an outer surface thereof.

11. The device of claim 1, wherein the work function metal components each include a nitride-based metallic material.

12. A device, comprising:
a semiconductor channel layer located over a substrate;
a gate dielectric layer located over the semiconductor channel layer;
a work function metal layer located over, and directly contacting, the gate dielectric layer; and
a bulk metal layer located over, and directly contacting, the work function metal layer;
wherein:
the work function metal layer, but not the bulk metal layer, is doped with silicon;
a first portion of the work function metal layer forms an interface with the gate dielectric layer;
a second portion of the work function metal layer interfaces with the bulk metal layer; and
the first portion has a higher silicon dopant concentration than the second portion.

13. The device of claim 12, wherein the work function metal layer contains TiN, TaN, WN, TiCN, TaCN, WCN, TiAlN, or TaAlN.

14. The device of claim 12, wherein:
the first portion of the work function metal layer has a silicon dopant concentration of about 1% to 10%; and
the second portion of the work function metal layer has a silicon dopant concentration of about 0.1% or lower.

15. The device of claim 12, wherein:
the second portion of the work function metal layer is thicker than the first portion of the work function metal layer; and
the first portion of the work function metal layer has a thickness in a range between about 2 angstroms and about 4 angstroms.

16. A method, comprising:
forming a gate dielectric layer that circumferentially surrounds a channel in a cross-sectional side view;
forming a work function metal layer that circumferentially surrounds the gate dielectric layer in the cross-sectional side view;
forming a silicide layer that circumferentially surrounds the work function metal layer in the cross-sectional side view; and
causing silicon elements of the silicide layer to be driven into the work function metal layer.

17. The method of claim 16, wherein an annealing process is performed to cause the silicon elements to be driven into the work function metal layer.

18. The method of claim 16, wherein the causing comprises causing the silicon elements to be driven to a portion of the work function metal layer adjacent to the gate dielectric layer.

19. The method of claim 16, further comprising:
removing the silicide layer after the causing the silicon elements of the silicide layer to be driven into the work function metal layer; and
forming a bulk metal layer that circumferentially surrounds the work function metal layer, the gate dielectric layer, and the channel in the cross-sectional side view.

20. The method of claim 16, wherein the forming the silicide layer comprises forming titanium silicide, zirconium silicide, or yttrium silicide as the silicide layer.

* * * * *